United States Patent
Liu et al.

(10) Patent No.: US 10,921,718 B2
(45) Date of Patent: Feb. 16, 2021

(54) TWO-DIMENSIONAL POSITION ENCODER

(71) Applicant: NIKON CORPORATION, Tokyo (JP)

(72) Inventors: Zhiqiang Liu, Kanagawa-ken (JP); Eric Goodwin, Oro Valley, AZ (US); Goldie Goldstein, Tucson, AZ (US)

(73) Assignee: NIKON CORPORATION

( * ) Notice: Subject to any disclaimer, the term of this patent is extended or adjusted under 35 U.S.C. 154(b) by 0 days.

(21) Appl. No.: 16/220,624

(22) Filed: Dec. 14, 2018

(65) Prior Publication Data
US 2019/0187572 A1    Jun. 20, 2019

Related U.S. Application Data

(60) Provisional application No. 62/599,318, filed on Dec. 15, 2017.

(51) Int. Cl.
*G01B 11/02* (2006.01)
*G03F 7/20* (2006.01)
(Continued)

(52) U.S. Cl.
CPC ........ *G03F 7/70775* (2013.01); *G01B 11/002* (2013.01); *G01D 5/38* (2013.01); *G03F 7/70516* (2013.01)

(58) Field of Classification Search
CPC ............. G03F 7/70775; G03F 7/70516; G01B 11/002; G01D 5/38; G01D 5/266;
(Continued)

(56) References Cited

U.S. PATENT DOCUMENTS

| | | |
|---|---|---|
| 5,925,956 A | 7/1999 | Ohzeki |
| 6,249,591 B1 | 6/2001 | Tullis |

(Continued)

OTHER PUBLICATIONS

Microsoft wireless laser mouse 7000 specifications: http://www.microsoft.com/hardware/en-us/d/wireless-laser-mouse-7000. The applicant admits that optical mice are prior art.
(Continued)

*Primary Examiner* — Tarifur R Chowdhury
*Assistant Examiner* — Jonathon Cook
(74) *Attorney, Agent, or Firm* — Roeder & Broder LLP; Steven G. Roeder

(57) ABSTRACT

A position encoder for monitoring relative movement between a first object and a second object includes a grating that is coupled to the first object, and an image sensor assembly that is coupled to the second object. The image sensor includes a first image sensor; a second image sensor that is spaced apart from the first image sensor; an optical element that includes a first optical surface and a second optical surface that is spaced apart from the first optical surface; and an illumination system. The illumination system directs an illumination beam at the optical element to create (i) a first reference beam that is reflected by the first optical surface and directed at the first image sensor, (ii) a second reference beam that is reflected by the second optical surface and directed at the second image sensor, and (iii) a transmitted beam that is transmitted through the optical element and is directed at and impinges on the grating to create a first measurement beam that is diffracted by the grating and directed at the first image sensor, and a second measurement beam that is diffracted by the grating and directed at the second image sensor.

29 Claims, 10 Drawing Sheets

(51) Int. Cl.
*G01B 11/00* (2006.01)
*G01D 5/38* (2006.01)

(58) Field of Classification Search
CPC ............... G01D 5/347; G01D 5/34707; G01D 5/34715; G01D 5/3473; G01D 5/34746
See application file for complete search history.

(56) References Cited

U.S. PATENT DOCUMENTS

| | | |
|---|---|---|
| 6,570,104 B1 | 5/2003 | Ericson et al. |
| 6,621,063 B2 | 9/2003 | McQueen |
| 6,963,074 B2 | 11/2005 | McQueen |
| 7,295,947 B2 | 11/2007 | Kurth et al. |
| 7,617,070 B2 | 11/2009 | Kurth et al. |
| 7,907,795 B2 | 3/2011 | Hardy et al. |
| 9,726,987 B2 | 8/2017 | Coon et al. |
| 2002/0079466 A1 | 6/2002 | Talmi |
| 2004/0130691 A1 | 7/2004 | Boonman et al. |
| 2006/0061768 A1* | 3/2006 | Duplain ............... G01D 5/266 356/479 |
| 2007/0246646 A1 | 10/2007 | Lum et al. |
| 2010/0157276 A1 | 6/2010 | Shibazaki |
| 2014/0204358 A1 | 7/2014 | Yang et al. |
| 2014/0368804 A1 | 12/2014 | LaFarre et al. |
| 2015/0108337 A1* | 4/2015 | Goodwin ............... G01D 5/38 250/231.1 |
| 2015/0241525 A1 | 8/2015 | Yang et al. |
| 2017/0076439 A1 | 3/2017 | Wells et al. |
| 2017/0329236 A1 | 11/2017 | Coon et al. |
| 2018/0217510 A1 | 8/2018 | Wells et al. |

OTHER PUBLICATIONS

How do optical mice work?: http://computer.howstuffworks.com/question631.htm. The applicant admits that optical mice are prior art.

* cited by examiner

TWO-DIMENSIONAL POSITION ENCODER

RELATED APPLICATION

This application claims priority on U.S. Provisional Application Ser. No. 62/599,318 filed on Dec. 15, 2017, and entitled "TWO-DIMENSIONAL POSITION ENCODER". As far as permitted, the contents of U.S. Provisional Application Ser. No. 62/599,318 are incorporated in their entirety herein by reference.

BACKGROUND

Measurement systems, such as position encoders, are used to measure position or monitor movement of an object, or to measure relative position or monitor relative movement between two objects. In some applications, sensitivity of such measurement systems may be required on the level of approximately 0.1 nanometers to 0.2 nanometers in terms of desired accuracy, such as for use in lithography wafer stages or similar applications. However, in many other applications, sensitivity of such measurement systems may only be required on the level of approximately one to five nanometers in terms of desired accuracy. In such applications where the level of desired accuracy is only on the order of a few nanometers, it is desired that such a measurement system be designed to be relatively low-cost and simple to manufacture and construct. Unfortunately, typical low-cost, low-resolution position encoders can suffer from measurement drift, low accuracy, lack of repeatability and other disadvantages.

SUMMARY

The present invention is directed toward a position encoder for monitoring relative movement between a first object and a second object. In various embodiments, the position encoder includes a grating that is coupled to the first object, and an image sensor assembly that is coupled to the second object. The image sensor assembly includes a first image sensor; a second image sensor that is spaced apart from the first image sensor; an optical element that includes a first optical surface and a second optical surface that is spaced apart from the first optical surface; and an illumination system. The illumination system directs an illumination beam at the optical element to create (i) a first reference beam that is reflected by the first optical surface and directed at the first image sensor, (ii) a second reference beam that is reflected by the second optical surface and directed at the second image sensor, and (iii) a transmitted beam that is transmitted through the optical element and is directed at and impinges on the grating to create a first measurement beam that is diffracted by the grating and directed at the first image sensor, and a second measurement beam that is diffracted by the grating and directed at the second image sensor.

In some embodiments, the grating is a one-dimensional diffraction grating such that the first measurement beam is a +1 order first measurement beam, and the second measurement beam is a −1 order second measurement beam.

Additionally, in certain embodiments, the first reference beam and the first measurement beam are interfered at the first image sensor to generate a first measurement signal; and the second reference beam and the second measurement beam are interfered at the second image sensor to generate a second measurement signal. The position encoder can further include a control system that receives the first measurement signal and the second measurement signal. The control system monitors the relative movement between the first object and the second object based at least in part on the first measurement signal and the second measurement signal. In some such embodiments, the control system monitors the relative movement between the first object and the second object in two degrees of freedom.

Additionally, in some embodiments, the control system applies a drift compensation algorithm to the first measurement signal to compensate for position drift of the first image sensor. Further, in such embodiments, the control system can also apply the drift compensation algorithm to the second measurement signal to compensate for position drift of the second image sensor. It is appreciated that the drift compensation algorithm can be employed within any suitable type of position encoder that measures fringe patterns with the image sensors, where a phase change of the fringe patterns varies across the image sensor. Thus, in such applications, the position encoder can also be referred to generally as a "fringe measurement system".

Further, in some embodiments, the optical element is substantially wedge-shaped; and the first optical surface can be at a wedge angle relative to the second optical surface of between approximately five degrees and thirty degrees. Additionally, in certain such embodiments, the first optical surface of the optical element is positioned at a position angle of between approximately zero degrees and fifteen degrees relative to a horizontal plane that is substantially parallel to a plane of the grating.

In certain embodiments, the illumination system includes a single illumination source fiber that launches the illumination beam toward the optical element. Additionally, the illumination source fiber can launch the illumination beam toward the optical element at an initial beam angle of between approximately two degrees and fifteen degrees relative to an axis that is orthogonal to a plane of the grating. Alternatively, in other embodiments, the illumination system includes a laser diode that launches the illumination into free space toward the optical element.

In some embodiments, the transmitted beam impinging on the grating is approximately normally incident on the grating.

Additionally, in certain embodiments, the illumination beam is temporally coherent and is not collimated. Further, each of the first image sensor and the second image sensor can include a one-dimensional array of detector elements.

The present invention is also directed toward a stage assembly including a stage that retains a device, a base that supports the stage, and a position encoder as described above that monitors movement of the device relative to the base.

Additionally, the present invention is further directed toward a method for monitoring relative movement between a first object and a second object. In various embodiments, the method includes the steps of (A) coupling a grating to the first object; (B) coupling an image sensor assembly to the second object, the image sensor assembly including a first image sensor; a second image sensor that is spaced apart from the first image sensor; an optical element that includes a first optical surface and a second optical surface that is spaced apart from the first optical surface; and an illumination system; and (C) directing an illumination beam at the optical element with the illumination system to create (i) a first reference beam that is reflected by the first optical surface and directed at the first image sensor, (ii) a second reference beam that is reflected by the second optical surface and directed at the second image sensor, and (iii) a transmitted beam that is transmitted through the optical element and is directed at and impinges on the grating to create a first measurement beam that is diffracted by the grating and directed at the first image sensor, and a second measurement beam that is diffracted by the grating and directed at the second image sensor.

Further, the present invention is also directed toward a fringe measurement system including (A) an image sensor assembly including an image sensor, and an illumination system that directs an illumination beam to create a first beam and a second beam that are directed toward the image sensor; the first beam and the second beam being interfered at the image sensor to generate a measurement signal; wherein a phase change of the measurement signal varies across the image sensor; and (B) a control system that is coupled to the image sensor assembly, the control system applying a drift compensation algorithm to the measurement signal to compensate for position drift of the image sensor, the drift compensation algorithm being based at least in part on the varying phase change of the measurement signal.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Embodiments of the present invention are described herein in the context of a two-dimensional position encoder that utilizes an image sensor assembly including a single illumination source, an optical element (e.g., a wedge-shaped optical element), and two one-dimensional image sensors (or line sensors) to provide desired position detection of an object at a relatively low cost. More specifically, as described in detail herein, in various embodiments, the problem of measuring stage position in two degrees of freedom on the nanometer level for low cost is solved by utilizing an image sensor assembly with a sensor head including a single illumination source fiber, a single glass wedge, and two one-dimensional image sensors (e.g., CCD arrays).

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application-related and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
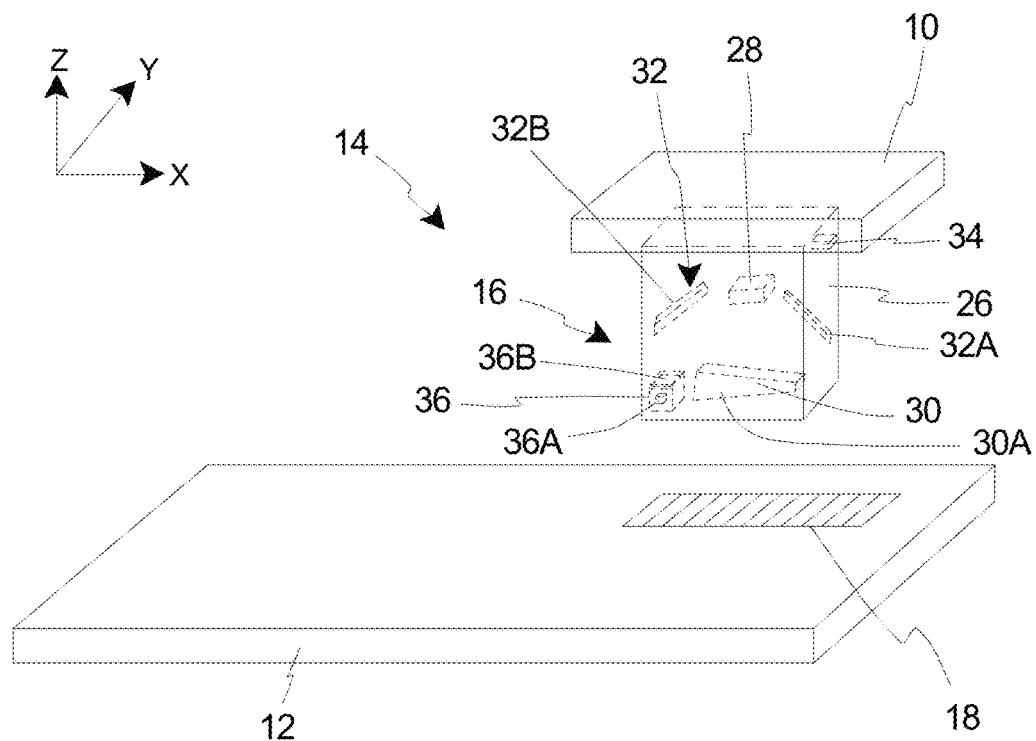
FIG. 1A is a simplified perspective view illustration of a first object, a second object, and an embodiment of a position encoder having features of the present invention that monitors relative movement and/or position between the first object and the second object, the position encoder including an image sensor assembly and a grating.

FIG. 1A is a simplified perspective view illustration of a first object 10, a second object 12, and an embodiment of a position encoder 14 having features of the present invention. The design of the position encoder 14 can be varied. As illustrated, in various embodiments, the position encoder 14 can include an image sensor assembly 16 and a grating 18 (a representative portion of which is illustrated in FIG. 1A). As provided in detail herein, the design of the image sensor assembly 16 and the grating 18 can be varied to suit the specific requirements and intended usages of the position encoder 14. Further, as shown, the image sensor assembly 16 can be coupled or otherwise attached to the first object 10, and the grating 18 can be coupled to or otherwise attached to the second object 12. With such design, the position encoder 14 can be utilized to monitor relative position and/or movement between the first object 10 and the second object 12. Still further, as shown in this embodiment, the image sensor assembly 16, and the various components contained therein, is spaced apart from the grating 18 along an axis, e.g., along the Z axis as shown in FIG. 1A.

Additionally, in certain embodiments, the position encoder 14 can also be utilized to measure the absolute position of the first object 10 and/or the second object 12 along the Z axis.

It is understood that the first object 10 and the second object 12 can be any suitable objects. Additionally, in some embodiments, the first object 10 can be configured to move relative to the second object 12 and the grating 18. Further, in certain embodiments, the second object 12 can be configured to move relative to the first object 10 and the image sensor assembly 16.

Some of the Figures provided herein include an orientation system that designates an X axis, a Y axis that is orthogonal to the X axis, and a Z axis that is orthogonal to the X and Y axes. In these Figures, the Z axis is generally oriented in the vertical direction. It should be understood that the orientation system is merely for reference and can be varied. For example, the X axis can be switched with the Y axis. Moreover, it should be noted that any of these axes can also be referred to as a first, a second, and/or a third axis.

In certain applications, the incremental position and/or movement of the first object 10 can be monitored by the position encoder 14 relative to a particular reference, e.g., to the second object 12 or another suitable reference. Alternatively, in other applications, the incremental position and/or movement of the second object 12 can be monitored by the position encoder 14 relative to a reference, e.g., the first object 10 or another suitable reference.

Additionally, it is appreciated that the position encoder 14 can be utilized in many alternative manners. For example, in certain applications, the position encoder 14 can be used as a standalone device for measuring or monitoring the position or movement of one of the objects 10, 12. Alternatively, in other applications, the position encoder 14 can be used as part of a stage assembly 620 (illustrated in FIG. 6) including a stage 622 (illustrated in FIG. 6) that retains a device 624 (illustrated in FIG. 6), for measuring or monitoring the position or movement of the stage 622 and the device 624, e.g., relative to a reference. Still alternatively, in still other applications, the position encoder 14 can be used in another suitable manner for measuring or monitoring the position or relative movement between the two objects 10, 12.

It is further appreciated that the position encoder 14 of the present invention can be incorporated into certain alternative configurations. For example, as provided herein, the position encoder 14 can be alternatively configured to operate as (i) a two-dimensional linear encoder (e.g., along the X axis and along the Z axis), and (ii) a rotary encoder that would allow for measurement of rotational angle and circular runout (see e.g., FIG. 1B). Additionally, in some applications, the position encoder 14 can be utilized in conjunction with additional position encoders to measure or monitor the position or relative movement between the two objects 10, 12 in greater than two degrees of freedom.

As noted, the design of the image sensor assembly 16 can be varied. For example, in various embodiments, as shown in FIG. 1A, the image sensor assembly 16 can include a sensor head 26, an illumination system 28 (illustrated in phantom), an optical system 30 (illustrated in phantom), a pair of image sensors 32 (illustrated in phantom), i.e. a first image sensor 32A and a second image sensor 32B, an electronic memory 34 (illustrated in phantom), and a control system 36 (illustrated in phantom). Alternatively, the image sensor assembly 16 can include more components or fewer components than those specifically illustrated and described in relation to FIG. 1A.

As an overview, the position encoder 14 is uniquely configured for measuring or monitoring position of one or more objects 10, 12 in two degrees of freedom on the nanometer level in a cost-effective manner. More specifically, in certain embodiments, the position encoder 14 is able to measure or monitor position of the object(s) 10, 12 in two-dimensions utilizing an image sensor assembly 16 with a sensor head 26 including a single illumination source fiber 228A (illustrated in FIG. 2), a single glass wedge 30, and two one-dimensional image sensors 32A, 32B (also sometimes referred to as "line sensors"). The type of measurement enabled through the use of the position encoder 14 offers an excellent tradeoff between cost, accuracy and ease of installation and use. Additionally, in some embodiments, the control system 36 can apply a drift compensation algorithm to compensate for any potential position drift of the image sensors 32A, 32B (also sometimes referred to herein as "sensor drift").

As illustrated, the sensor head 26 provides a rigid housing for the other components of the image sensor assembly 16. More particularly, as shown, in certain embodiments, the illumination system 28, the optical system 30, the image sensors 32, the electronic memory 34 and the control system 36 can be positioned and retained substantially within the sensor head 26. Alternatively, one or more components of the image sensor assembly 16 can be positioned remotely from the sensor head 26. For example, in one non-exclusive alternative embodiment, the control system 36 can be included and positioned remotely from the sensor head 26.

The size, shape and design of the sensor head 26 can be varied. For example, in certain embodiments, the sensor head 26 is substantially rectangular box-shaped. Alternatively, the sensor head 26 can have another suitable shape.

During use of the position encoder 14, the illumination system 28 is configured and oriented to generate an illumination beam 238 (illustrated in FIG. 2), i.e. a single illumination beam 238, and direct the illumination beam 238 initially toward the optical system 30, with a portion of the illumination beam 238 being subsequently directed toward the grating 18. The illumination beam 238 includes a plurality of rays. Additionally, as noted, a portion of the illumination beam 238, i.e. a portion of the plurality of rays from the illumination beam 238, is subsequently directed from the illumination system 28 so as to impinge on the grating 18.

The design of the illumination system 28 can be varied. For example, in the embodiment illustrated in FIG. 1A, the illumination system 28 can include a laser, a laser diode, or another suitable type of illumination system that directs the illumination beam 238 toward the optical system 30 to illuminate the optical system 30 and/or toward the grating 18 to illuminate the grating 18. Additionally, in various embodiments, the illumination system 28 can be configured to generate a temporally coherent illumination beam 238 that is not collimated. Alternatively, in other embodiments, the optical system 30 can include one or more lenses, mirrors or other optical elements that collimate the illumination beam 238 that is directed from the illumination source fiber 228A.

Further, the wavelength of the illumination beam 238 can be varied as desired. For example, in certain embodiments, the illumination beam 238 can have a wavelength that is in the visible light spectrum of between approximately 380 nanometers and 750 nanometers. In one non-exclusive embodiment, the illumination beam 238 has a nominal wavelength of approximately 632.8 nanometers. Alternatively, the illumination beam 238 can have a wavelength that is less than approximately 380 nanometers or greater than approximately 750 nanometers.

The optical system 30 is positioned in the path of the illumination beam 238 between the illumination system 28 and the grating 18. As described in greater detail herein below, in certain embodiments, the optical system 30 can include a substantially wedge-shaped optical element 30A (e.g., a glass wedge) that reflects portions of the illumination beam 238 and directs other portions of the illumination beam 238 toward the grating 18. Additionally, the optical system 30, i.e. the wedge-shaped optical element 30A, can also be configured to direct and focus portions of the illumination beam 238 that have been diffracted by the grating 18 onto the image sensors 32A, 32B. Alternatively, the optical system 30 can have another suitable design. In FIG. 1A, the optical element 30A is rectangular wedge-shaped. Alternatively, the optical element 30A can be another shape, such as circular wedge-shaped. It is further appreciated that the optical system 30, i.e. the wedge-shaped optical element 30A, can be oriented in any suitable direction.

As provided herein, each of the image sensors 32 is configured for capturing, sensing, detecting and/or recording information, e.g., fringe patterns, generated from the interference of a reference beam and a measurement beam. More specifically, as described in greater detail herein below, the reference beams are provided by portions of the illumination beam 238 being reflected by optical surfaces of the optical element 30A, and the measurement beams are provided by other portions of the illumination beam 238 impinging on and being diffracted by the grating 18. In certain embodiments, the image sensors 32 can be linear one-dimensional CCD or CMOS type image sensors that include a one-dimensional array of detector elements 440 or pixels (illustrated in FIG. 4). In such embodiments, a portion of the information, e.g., fringe pattern, is captured, sensed, detected and/or recorded at each detector element 440 or pixel. Alternatively, the image sensors 32 can have another suitable design.

With the design noted above, the image sensors 32 can successively sense and capture light information from the illumination beam 238 being diffracted by the grating 18 and being reflected by the optical element 30A as the image sensor assembly 16, i.e. the sensor head 26 and/or the image sensors 32, and the grating 18 are moved relative to one another. Additionally, the image sensors 32 can utilize the sensed or captured information to generate signals relevant to the movement between the image sensor assembly 16 and the grating 18, and/or between the first object 10 and the second object 12.

As provided herein, with the specific design of the position encoder 14, off-axis Newton fringes can be observed by the image sensors 32. Additionally, because the position encoder 14 typically utilizes one-dimensional image sensors 32, only a single pass off the grating 18 is required since the position encoder 14 requires fringes in order to work properly. More particularly, with such design, two passes off the grating 18 with a retroreflection in between to cancel out any beam angle change due to tip, tilt or rotation of the grating 18 is not needed because the position encoder 14 relies on having an optical path difference ("OPD") between reference beams and measurement beams.

The electronic memory 34 is configured to store and retain any electronic data and information that may be required for effective use of the position encoder 14. For example, the electronic memory 34 can be utilized to retain the various signals that are generated through use of the image sensors 32 during use of the position encoder 14. Additionally, any previously generated signals can be utilized as a point of reference to determine subsequent relative movement between the image sensor assembly 16 and the grating 18, and/or between the first object 10 and the second object 12.

The control system 36 is configured to control the operation of the image sensor assembly 16 and/or the position encoder 14. For example, in certain embodiments, the control system 36 can analyze successive signals generated by the image sensors 32 to effectively monitor the position and movement of the image sensor assembly 16, i.e. the image sensors 32 (and thus the first object 10), relative to the grating 18 (and thus the second object 12). Additionally, as noted above, in some embodiments, the control system 36 can be uniquely configured to compensate for any potential position drift (or sensor drift) of the image sensors 32. The control system 36 can include one or more processors 36A (illustrated in phantom) and one or more circuit boards 36B (illustrated in phantom), and can be programmed to perform one or more of the steps provided herein.

As noted above, during use of the position encoder 14, portions of the illumination beam 238 are directed toward the grating 18 and impinge on the grating 18. In various embodiments, the grating 18 is a diffraction grating that acts somewhat like a beam splitter that creates one or more diffracted beams that are directed back at the sensor head 26. For example, in some such embodiments, the grating 18 is a one-dimensional grating (a grating with parallel lines running in one direction). With such design, the grating 18 creates two primary diffraction orders. Alternatively, the grating 18 can be a two-dimensional grating that includes two sets of parallel lines (not shown) that run substantially perpendicular to one another in a checkerboard-like manner. With such alternative design, the grating 18 creates four primary diffraction orders. Additionally, in certain non-exclusive embodiments, the grating 18 has a period, or pitch, of between approximately one and two microns. For example, in one non-exclusive embodiment, the grating 18 has a pitch of approximately 1667 nanometers.

Figure 1B:
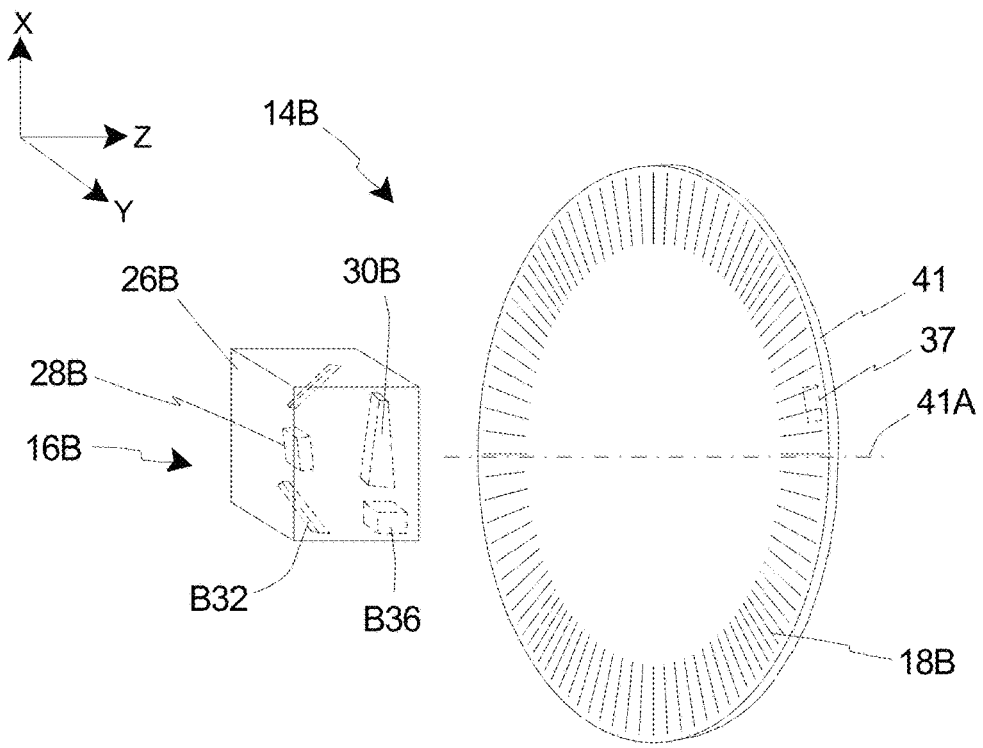
FIG. 1B is a simplified perspective view illustration of another embodiment of the position encoder.

FIG. 1B is a simplified perspective view illustration of another embodiment of the position encoder 14B. More specifically, FIG. 1B illustrates the position encoder 14B having features of the present invention being configured to operate as a rotary encoder. As shown in FIG. 1B, the position encoder 14B includes an image sensor assembly 16B having a sensor head 26B, an illumination system 28B (illustrated in phantom), an optical system 30B (illustrated in phantom), a pair of image sensors B32 (illustrated in phantom), and a control system B36 (illustrated in phantom); and a grating 18B.

Additionally, in this embodiment, the grating 18B is coupled to a disk 41. Further, as shown, the disk 41 can have a rotational axis 41A about which the disk 41 rotates. The disk 41 and thus the rotational axis 41A can be oriented in any suitable manner. For example, in one embodiment, the disk 41 can be oriented such that the rotational axis 41A is parallel to the axis, e.g., the Z axis, and the image sensor assembly 16B is spaced apart from the grating 18B along the Z axis. In another embodiment, the disk 41 can be oriented such that the rotational axis 41A is perpendicular to the axis, e.g., the Z axis, which defines the spacing between the image sensors B32 and the grating 18B. Also shown in FIG. 1B is an illuminated region 37 (illustrated with a small dashed rectangle) on the disk 41 that is illuminated with the illumination system 28B.

In certain embodiments, the image sensors B32 can include an array of detector elements (not shown in FIG. 1B) that are arranged in one of an arc about the rotational axis 41A and in a line tangential to the rotational axis 41A. In such embodiments, the control system B36 can monitor the rotational position and/or movement of an object (to which the image sensors B32 are coupled) about the rotational axis 41A relative to the grating 18B. In other embodiments, the image sensors B32 can include an array of detector elements that are arranged in one of radially about the rotational axis 41A and perpendicular to a line tangential to the rotational axis 41A. In such embodiments, the control system B36 can determine the radial position and/or movement of the object relative to the grating 18B.

Figure 2:
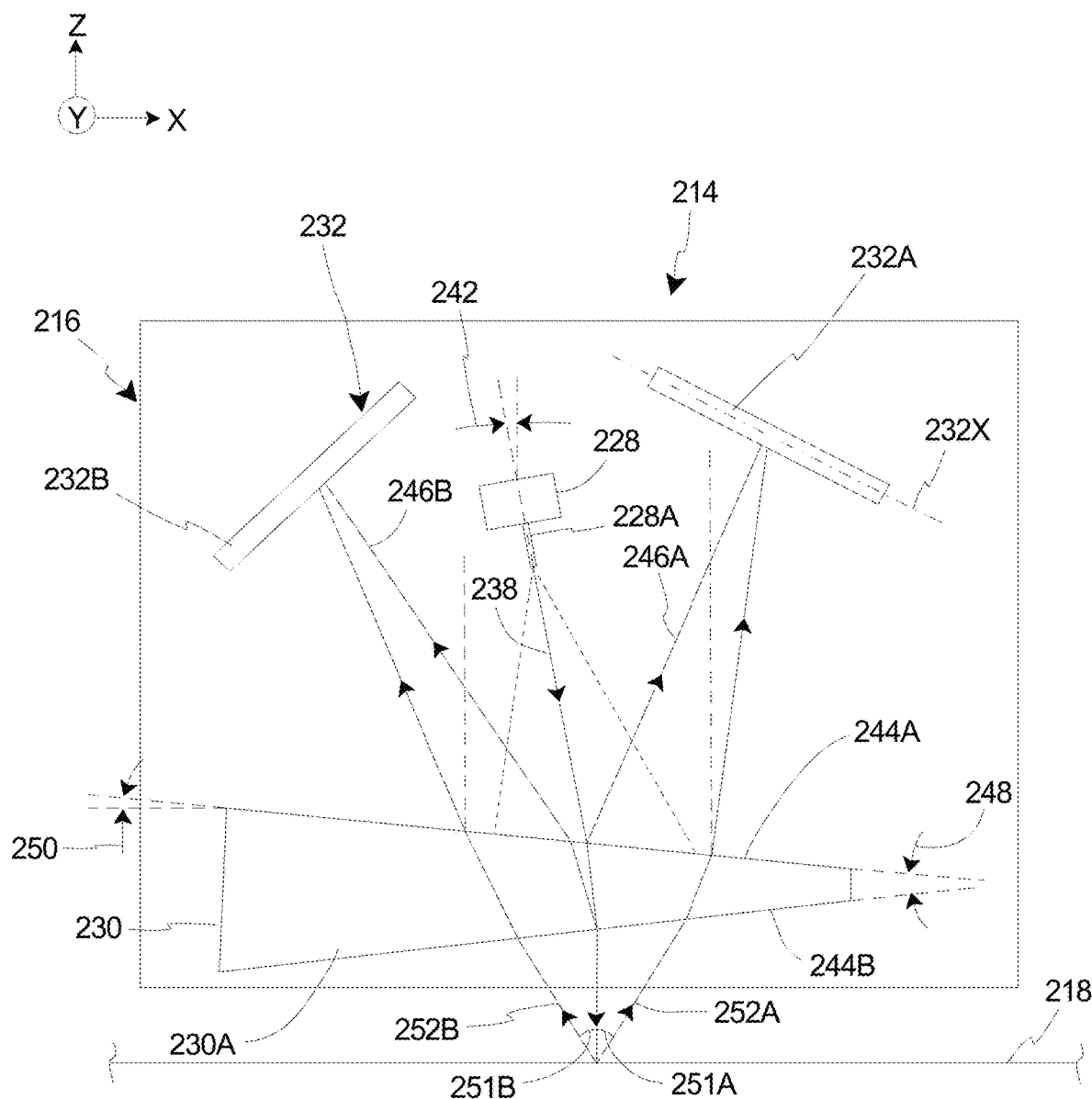
FIG. 2 is a simplified schematic side view illustration of an embodiment of the position encoder having features of the present invention.

FIG. 2 is a simplified schematic side view illustration of an embodiment of the position encoder 214 having features of the present invention. As above, the position encoder 214 includes an image sensor assembly 216 having a sensor head 226, an illumination system 228, an optical system 230, a pair of image sensors 232, i.e. a first image sensor (+1 order) 232A and a second image sensor (−1 order) 232B; and a grating 218. It is appreciated that the electronic memory 34 and the control system 36 are not illustrated in FIG. 2 for purposes of clarity. It should be noted that (i) the first image sensor 232A can also be referred to as a +1 image sensor or image sensor A; and (ii) the second image sensor 232B can also be referred to as a −1 image sensor or image sensor B.

The illumination system 228 generates an illumination beam 238 that is directed along a beam path 238A initially toward the optical system 230, i.e. the wedge-shaped optical element 230A, and subsequently toward the grating 218. As noted above, the illumination system 228 can include a laser, a laser diode, or another suitable type of illumination system. Additionally, as illustrated in FIG. 2, the illumination system 228 includes a single illumination source fiber 228A that launches the illumination beam 238 and directs the illumination beam 238 initially toward the optical element 230A, with a portion of the illumination beam 238 subsequently being directed toward the grating 218. In one embodiment, the illumination source fiber 228A can have a numerical aperture ("NA") of 0.1. Alternatively, the illumination source fiber 228A can have another suitable design. Further, or in the alternative, the illumination system 228 can include a laser diode that launches the illumination beam 238 into free space initially toward the optical element 230A, and subsequently toward the grating 218.

As provided herein, it is desired that the illumination beam 238 be directed toward the grating 218 so as to be approximately normally incident on the grating 218. As utilized herein, in certain embodiments, the illumination beam 238 being approximately normally incident on the grating 218 means that the illumination beam 238 is within approximately 0.0 degrees, 0.05 degrees, 0.10 degrees, 0.15 degrees, 0.20 degrees, 0.25 degrees, or 0.30 degrees of being normally incident on the grating 218. This allows for equal sensitivity in the Z direction for the two resulting phase measurements. Thus, it is desired that the illumination system 228 and the optical element 230A be designed, positioned and oriented such that the portion of the illumination beam 238 that is subsequently directed toward the grating 218 can be approximately normally incident on the grating 218. Accordingly, in the embodiments provided herein, the sensor head 226, and the individual components therein, directs the illumination beam 238 at the grating 218 so that the illumination beam 238 impinges on the grating 218 in a direction that is substantially normal to the grating 218.

In certain embodiments, the illumination system 228 and/or the illumination source fiber 228A can be oriented to provide an initial beam angle 242 as the illumination beam 238 is directed along the beam path 238A toward the optical element 230A. As shown, the initial beam angle 242 is measured relative to an axis that is parallel to the Z axis (and normal or orthogonal to a plane of the grating 218). Stated in another manner, the initial beam angle 242 of the beam path 238A is measured relative to the Z axis. In some non-exclusive alternative embodiments, the illumination system 228 and/or the illumination source fiber 228A can be oriented such that the illumination beam 238 is directed along the beam path 238A at an initial beam angle 242 of between approximately two degrees and fifteen degrees relative to the Z axis. Alternatively, the illumination system 228 and/or the illumination source fiber 228A can be oriented such that the illumination beam 238 is directed along the beam path 238A at an initial beam angle 242 of greater than fifteen degrees or less than two degrees relative to the Z axis.

Additionally, as shown and as noted above, in certain embodiments, the illumination beam 238 can be an uncollimated beam that includes a plurality of rays having a substantially spherical wavefront. The spherical wavefront is illustrated in FIG. 2 with a pair of dashed lines that extend outwardly on either side of a central ray of the illumination beam 238 as the illumination beam 238 is directed from the illumination source fiber 228A to the optical element 230A. It is appreciated that the spherical wavefront of the illumination beam 238 (and the other beams that are created from the illumination beam 238) after the illumination beam 238 initially impinges on the optical element 230A is not shown in FIG. 2 for purposes of clarity. More specifically, only the central ray of the illumination beam 238 (and the other beams that are created from the illumination beam 238) are shown after the illumination beam 238 initially impinges on the optical element 230A in FIG. 2 for purposes of clarity.

As shown in this embodiment, the optical element 230A is substantially wedge-shaped and includes a first (upper) optical surface 244A and a second (lower) optical surface 244B. In certain embodiments, the first optical surface 244A and the second optical surface 244B of the optical element 230A are substantially planar in design. Alternatively, the first optical surface 244A and/or the second optical surface 244B can be somewhat curved in design.

As illustrated, the original illumination beam 238 hitting the optical element 230A, i.e. the glass wedge, results in the creation of multiple beams. Thus, during use of the position encoder 214, the optical element 230A functions, at least in part, as a beam splitter.

In some embodiments, the first optical surface 244A and the second optical surface 244B can be configured to have a certain reflectivity so as to reflect a certain percentage of the rays of the illumination beam 238 impinging on the surfaces 244A, 244B while also transmitting some of the illumination beam 238. In certain embodiments, the wedge-shaped design of the optical element 230A is used to obtain two reference beams. More specifically, each of the surfaces 244A, 244B can have a reflective coating provided thereon to reflect a certain percentage of the rays of the illumination beam 238 impinging on the surfaces 244A, 244B. For example, in certain embodiments, the surfaces 244A, 244B can be configured to reflect between approximately two percent and twenty percent of the rays of any beam impinging on the surfaces 244A, 244B. In one such embodiment, each of the optical surfaces 244A, 244B can be configured to reflect approximately ten percent of the rays of any beam impinging on the surfaces 244A, 244B. Alternatively, the optical surfaces 244A, 244B can have a reflective coating that reflects greater than twenty percent or less than two percent of the rays of any beam impinging on the optical surfaces 244A, 244B. Still alternatively, the optical surfaces 244A, 244B can be uncoated, in which case they can reflect between approximately three percent and five percent of the rays of any beam impinging on the optical surfaces 244A, 244B based on Fresnel reflection.

As shown in FIG. 2, a portion of the illumination beam 238 impinging on the first optical surface 244A is reflected off of the first optical surface 244A and is directed toward the first image sensor 232A as a first reference beam 246A. Additionally, as also shown in FIG. 2, a portion of the illumination beam 238 impinging on the second optical surface 244B is reflected off of the second optical surface 244B and is directed toward the second image sensor 232B as a second reference beam 246B. Thus, FIG. 2 illustrates that the reference beams 246A, 246B can be created as the partial reflection from the optical surfaces 244A, 244B of the optical element 230A. Further, with this design, it is noted that the two reference beams 246A, 246B do not ever hit the grating 218.

Additionally, as illustrated, another portion of the illumination beam 238 is transmitted through the first optical surface 244A and the second optical surface 244B as a transmitted beam 247 and is directed at the grating 218 so as to be approximately normally incident on the grating 218. In certain alternative embodiments, the optical system 230 can further include one or more mirrors (not illustrated) that can be used to direct this transmitted beam 247 at the grating 218.

In order to ensure the desired normal incidence of the illumination beam 238 on the grating 218, the optical element 230A can be designed and oriented to have a particular wedge angle 248 and a particular position angle 250. As utilized herein, the wedge angle 248 can be defined as the angle of the first optical surface 244A relative to the second optical surface 244B. Additionally, as utilized herein, the position angle 250 can be defined as the angle (or tilt) of the first optical surface 244A relative to the horizontal plane of the X axis and the Y axis and/or relative to a plane of the grating 218. In some embodiments, the optical element 230A can have a wedge angle 248 of between approximately five degrees and thirty degrees. Additionally, in some embodiments, the optical element 230A can be oriented to have a position angle 250 of between approximately zero degrees and fifteen degrees relative to the horizontal plane of the X axis and the Y axis. In one non-exclusive alternative embodiment, the optical element can be a BK7 wedge having a wedge angle 248 of approximately sixteen degrees that is oriented at a position angle 250 of approximately six degrees. Alternatively, the optical element 230A can have a wedge angle 248 of greater than thirty degrees or less than five degrees, and/or the optical element 230A can be oriented to have a position angle 250 of greater than fifteen degrees or less than zero degrees.

As noted above, the portion of the illumination beam 238 that becomes the transmitted beam 247 is not initially reflected by the first optical surface 244A or the second optical surface 244B of the optical element 230A and is directed toward and impinges on the grating 218. In various embodiments, the grating 218 is a diffraction grating that acts somewhat like a beam splitter that creates one or more diffracted beams that are directed back at the sensor head 226. For example, in some such embodiments, the grating 218 is a one-dimensional grating that creates two primary diffraction orders. Alternatively, the grating 218 can be designed as a two-dimensional grating that creates four primary diffraction orders.

In embodiments that utilize the one-dimensional grating 218, the illumination beam 238 impinging on the grating 218 creates two primary diffraction orders: (i) a +1 order first beam 252A, and (ii) a −1 order second beam 252B. Thus, when utilizing a one-dimensional grating 218, the illumination beam 238 impinging on the grating 218 creates two first order beams that are directed back at the sensor head 226. As illustrated in FIG. 2, when the +1 order first beam 252A and the −1 order second beam 252B are directed back at the sensor head 226, they are directed back toward the optical system 230, i.e. the glass wedge 230A.

Subsequently, a portion of each of these diffracted beams, i.e. the +1 order first beam 252A and the −1 order second beam 252B, is refracted by the optical element 230A and is then directed toward the respective image sensors 232A, 232B. More specifically, as illustrated, a portion of the +1 order first beam 252A is refracted by the optical element 230A and is directed toward the first image sensor 232A as a first measurement beam 253A; and a portion of the −1 order second beam 252B is refracted by the optical element and is directed toward the second image sensor 232B as a second measurement beam 253B. The measurement beams 253A, 253B are subsequently used to measure the movement of the grating 218 relative to the sensor head 226, i.e. by interfering the measurement beams 253A, 253B with the reference beams 246A, 246B, respectively. It should be noted that by utilizing diffracted light beams from the grating 218 instead of reflected light beams, the grating 218 structure can be greatly simplified and errors that may otherwise result from the reflections from multiple interfaces of the grating 218 may be avoided.

Thus, as shown, the first reference beam 246A and the first measurement beam 253A are both directed toward the first image sensor 232A; and the second reference beam 246B and the second measurement beam 253B are both directed toward the second image sensor 232B. With such design, the first reference beam 246A and the first measurement beam 253A can be interfered with one another at the first image sensor 232A to provide a first measurement signal that is sensitive in two degrees of freedom, e.g., to movement in the X and Z directions. Somewhat similarly, the second reference beam 246B and the second measurement beam 253B can be interfered with one another at the second image sensor 232B to provide a second measurement signal that is sensitive in two degrees of freedom, e.g., to movement in the X and Z directions. Subsequently, the control system 36 (illustrated in FIG. 1A) can utilize the first measurement signal and the second measurement signal to effectively monitor position and/or relative movement between the image sensors 232A, 232B and the grating 218; and, thus, the position and/or relative movement between the first object 10 (illustrated in FIG. 1A) and the second object 12 (illustrated in FIG. 1A).

Additionally, it is further noted that any stray beams that are generated as the illumination beam 238 impinges on and/or passes through the optical element 230A and then impinges on the grating 218 are not illustrated for purposes of clarity. In many instances, there will be many stray beam paths that will all be coherent with the main beams. However, there are several ways to remove them from the system. For example, stray beams can be removed by doing one or more of the following: (i) rotating the optical element 230A about the Y axis and/or about the Z axis; (ii) putting an out-of-plane wedge angle between the first and second wedge surfaces 244A, 244B for the two reference beams 246A, 246B; and (iii) rotating the entire sensor head 226 about the Z axis. It is appreciated that the stray beams have relatively low power compared to the reference beams 246A, 246B and measurement beams 253A, 253B, because the stray beams make multiple diffractions and/or reflections while the reference beams 246A, 246B and measurement beams 253A, 253B make only one reflection or diffraction and are therefore relatively high-powered. This is because each reflection/diffraction reduces the power in the beam by approximately seventy percent to ninety-eight percent per interaction. Additionally, it is further appreciated that in most instances the stray beams can be ignored and/or disregarded because the angles of the stray beams relative to the references beams 246A, 246B and the measurement beams 253A, 253B are too large such that the fringes they create are too small to be seen by the one-dimensional image sensors 232A, 232B.

In summary, the concept disclosed herein in this embodiment is for a single illumination source, e.g., a single mode input fiber, a laser diode, or another suitable illumination source, to launch an illumination beam 238 that is not collimated, but instead allowed to expand as a spherical wavefront towards a glass wedge 230A. The illumination beam 238 is refracted so that it is normally incident on the grating 218, which is mounted to a moving work piece or object (or vice versa). The first (top) and second (bottom) surfaces 244A, 244B of the glass wedge 230A are partially reflective in order to create reference beams 246A, 246B, one going to each of the two image sensors 232A, 232B (e.g., one-dimensional CCD arrays). The grating 218, shown here as a one-dimensional grating, create two measurement beams, a (+1 order) first measurement beam 253A and a (−1 order) second measurement beam 253B. Each measurement beam 253A, 253B has been refracted as it is transmitted back through the glass wedge 230A to the separate image sensors 232A, 232B, respectively, where they will interfere with the respective reference beams 246A, 246B.

It is appreciated that there is no need for a separate reference signal since the measurement beams 253A, 253B and the reference beams 246A, 246B share a common path up until the initial impingement on the optical element 230A, i.e. the glass wedge. In other words, all of the optical path difference occurs after the top surface 244A of the glass wedge 230A, and nothing prior to that top surface 244A will introduce an optical path difference change or measurement error. Additionally, it is further appreciated that by having a single pass off of the grating 218, it is guaranteed that the two measurement beams 253A, 253B are from the same point on the grating 218, thereby reducing the complexity of any geometric error corrections that may be needed. Further, it is also appreciated that the single mode illumination source fiber 228A ensures a high degree of spatial coherence for the imperfectly overlapping interfering beams, i.e. the imperfectly overlapping first reference beam 246A and first measurement beam 253A at the first image sensor 232A, and the imperfectly overlapping second reference beam 246B and second measurement beam 253B at the second image sensor 232B. Large temporal coherence is also important since the path lengths are not equal. For example, in certain non-exclusive embodiments, the path difference can be between approximately three and twenty millimeters depending on the encoder design, the working distance between the grating 218 and the glass wedge 230, and which of the two measurement signals is under consideration.

Further, it is understood that stability of the position encoder 214 and the measurement signals generated therefrom may be affected by position drift of the one-dimensional image sensors 232A, 232B, e.g., the CCDs, and also by position drift and refractive index changes of the optical element 230A, i.e. the glass wedge. For example, the position encoder 214 may be expected to suffer from measurement error if the image sensors 232A, 232B drift or move during use, e.g., relative to a sensor axis 232X that is oriented along a length of the image sensor 232A, 232B, with some level of position drift for the image sensors 232A, 232B being normal since the image sensors 232A, 232B run at high temperatures and may experience some degree of thermal expansion, e.g., relative to the sensor axis 232X, as they heat up during use. In such situations, the fringe pattern will move relative to the image sensor 232A, 232B, and it will be difficult to distinguish this from a movement of the fringe pattern due to relative movement of the grating 218. Accordingly, in certain embodiments, it is preferred to integrate the one-dimensional image sensors 232A, 232B into the same package as the optical element 230A and the illumination system 228. Thus, in such embodiments, each of the optical element 230A, the illumination system 228, the first image sensor 232A and the second image sensor 232B are housed and/or retained within the same sensor head 226.

Additionally, in some embodiments, the position encoder 214 can incorporate any suitable method to compensate for any potential position drift of the image sensors 232A, 232B and/or the optical element 230A. For example, in certain such embodiments, as described in detail herein below in relation to FIGS. 7-9, the control system 36 can utilize a specially designed drift compensation algorithm that utilizes fringe pitch variation across the image sensor 232A, 232B to enable direct measurement of sensor drift, and, thus, compensation for the sensor drift. Thus, through use of the drift compensation algorithm, the control system 36 can remove the influence of sensor motion, i.e. position drift of the image sensor 232A, 232B, and determine the actual phase change of the fringe pattern due to relative movement between the position encoder 214 and the grating 218.

Still further, in certain embodiments, the image sensors 232A, 232B can be configured to run at about 1 kHz line rate, so any data processing needs to be at least this fast. It is understood that this likely requires a dedicated field-programmable gate array ("FPGA") for systems that want to utilize this signal for position servoing.

As provided herein, the angles of (i) the diffracted beams 252A, 252B coming off the grating 218 relative to a parallel to the Z axis, (ii) the measurement beams 253A, 253B at the image sensors 232A, 232B relative to a parallel to the Z axis, and (iii) the reflected (reference) beams 246A, 246B relative to a parallel to the Z axis, can be generated utilizing inputs of the initial beam angle 242, the wedge angle 248, the position angle 250, and the pitch, T, of the grating 218. Stated in another fashion, the initial beam angle 242, the wedge angle 248, the position angle 250, the refractive index of the optical element 230A at the wavelength of the illumination beam 238, n, and the pitch, T, of the grating 218 can be adjusted to adjust the angles of the diffracted beams 252A, 252B, the measurement beams 253A, 253B, and the reflected (reference) beams 246A, 246B. Initially, a proper or desired initial beam angle 242 ("θ") can be determined based on the wedge angle 248 ("α") and the position angle 250 ("φ") to provide the desired normal incidence for the illumination beam 238 on the grating 218 as provided in Equation 1 below:

$$\theta = \sin^{-1}\left[n\sin\left[\alpha - \sin^{-1}\left(\frac{\sin(\alpha-\varphi)}{n}\right)\right]\right] - \varphi \quad \text{(Equation 1)}$$

Additionally, the calculation of the angles of the measurement beams 252A, 252B and the reference beams 246A, 246B, can also utilize the general diffraction equation when the angle of incidence is zero degrees (0°), where:

$$\sin(\theta_d) = \frac{m\lambda}{T} \quad \text{(Equation 2)}$$

$$\theta_d = \sin^{-1}\left(\frac{-\lambda}{T}\right) \quad \text{(Equation 3)}$$

where m is the diffraction order (+1 or −1), λ is the wavelength, and T is the pitch of the grating 218.

The +1 first measurement beam angle, $\beta_{+1}$, (shown with reference number 251A in FIG. 2) can then be calculated as:

$$\beta_{+1} = \varphi - \sin^{-1}\left(n\sin\left(\alpha - \sin^{-1}\left(\frac{\sin\left(\sin^{-1}\left(\frac{m\lambda}{T}\right) + \alpha - \varphi\right)}{n}\right)\right)\right) \quad \text{(Eq. 4)}$$

Also, the −1 second measurement beam angle, $\beta_{-1}$, (shown with reference number 251B in FIG. 2) can then be calculated as:

$$\beta_{-1} = \sin^{-1}\left(n\sin\left(\sin^{-1}\left(\frac{\sin\left(\sin^{-1}\left(\frac{-\lambda}{T}\right) - \varphi + \alpha\right)}{n}\right) - \alpha\right)\right) + \varphi \quad \text{(Eq. 5)}$$

Further, the reflected first reference beam angle, $\gamma_{+1}$, is calculated as:

$$\gamma_{+1} = \theta + 2\varphi \quad \text{(Equation 6)}$$

and, the reflected second reference beam angle, $\gamma_{-1}$, is calculated as:

$$\gamma_{-1} = \varphi - \sin^{-1}\left[n\sin\left[2\alpha - \sin^{-1}\left(\frac{\sin(\theta+\varphi)}{n}\right)\right]\right] \quad \text{(Equation 7)}$$

Thus, based on these calculations of the measurement beam angles and the reflected beam angles, the image sensors 232A, 232B can be properly positioned within the sensor head 226 to effectively receive the respective reference beams 246A, 246B and measurement beams 253A, 253B so that they can be interfered with one another to generate the first measurement signal and the second measurement signal, respectively.

It is appreciated that in various embodiments, the initial beam angle 242 ("θ"), the wedge angle 248 ("α"), and the position angle 250 ("φ"), as well as the pitch, T, of the grating, the wavelength, λ, of the beams, and the refractive index, n, of the optical element, can be adjusted such that there would be no aliasing of the fringes. Aliasing is the situation where the fringe phase per pixel on the sensor exceeds pi (π) radians per pixel. For example, in one non-exclusive alternative embodiment, setting the initial beam angle 242 at 6.9 degrees, the wedge angle 248 at 13.28 degrees, the position angle 250 at 2.5 degrees, the pitch of the grating at 1.667 microns, the wavelength at 0.633 microns, and the refractive index at 1.5151, results in fringe patterns with no aliasing. Alternatively, these variables can be adjusted to have different suitable values.

Figure 3:
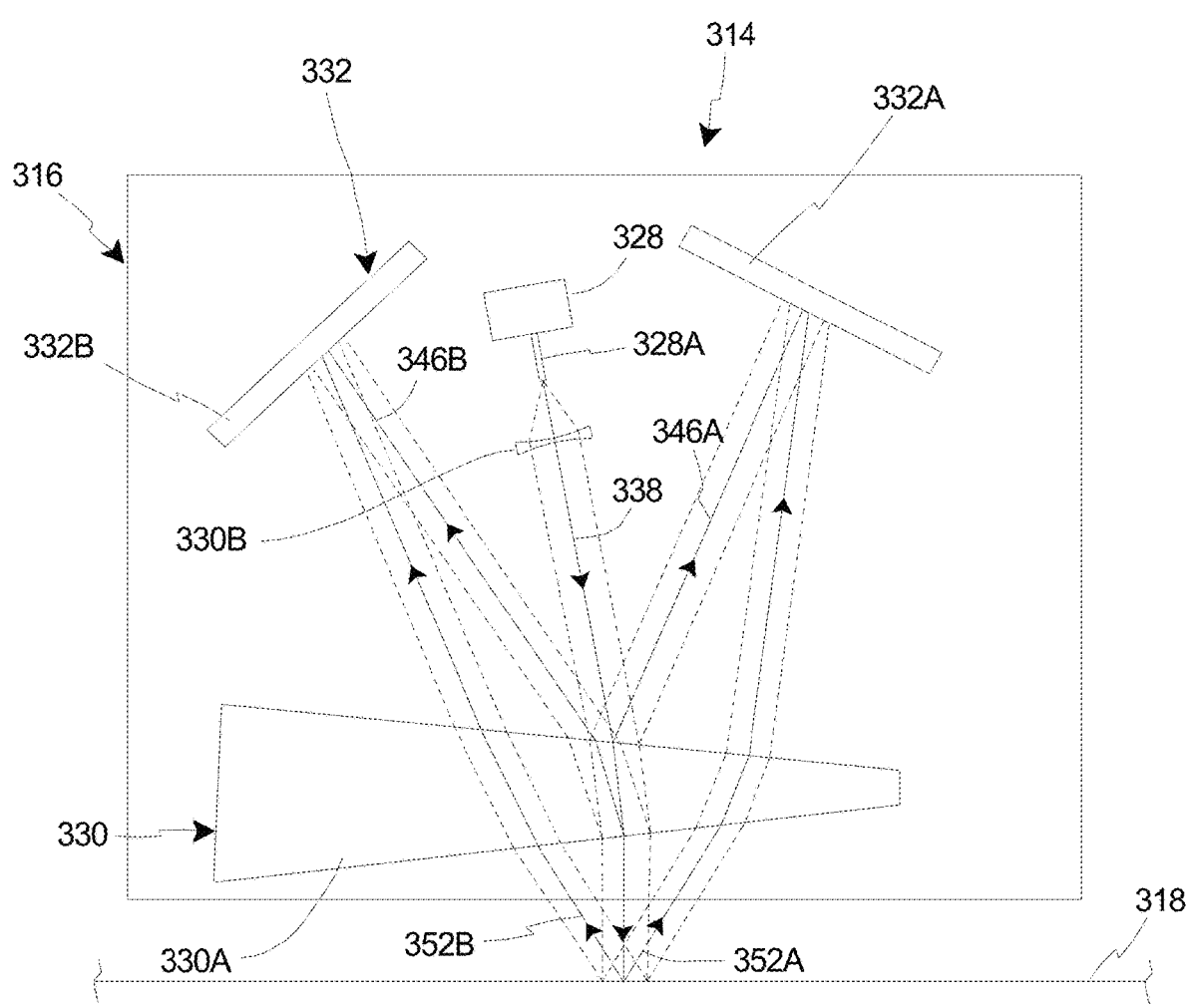
FIG. 3 is a simplified schematic side view illustration of another embodiment of the position encoder.

FIG. 3 is a simplified schematic side view illustration of another embodiment of the position encoder 314. As illustrated, the position encoder 314 is substantially similar to the position encoder 214 illustrated and described in relation to FIG. 2. For example, the position encoder 314 again includes an image sensor assembly 316 having a sensor head 326, an illumination system 328, an optical system 330, a pair of image sensors 332, i.e. a first image sensor 332A and a second image sensor 332B; and a grating 318. FIG. 3 also illustrates the illumination beam 338, the reference beams 346A, 346B, the +1 order and −1 order diffracted beams 352A, 352B, and the measurement beams 353A, 353B that are somewhat similar to those in the previous embodiment. It is again appreciated that the electronic memory 34 and the control system 36 are not illustrated in FIG. 3 for purposes of clarity.

Additionally, FIG. 3 also illustrates that the illumination system 328 again includes a single illumination source fiber 328A that launches the illumination beam 338 and directs the illumination beam 338 initially toward the optical system 330. However, in this embodiment, the optical system 330 has a somewhat different design than in the previous embodiment. More specifically, in addition to the optical element 330A, the glass, wedge-shaped optical element, the optical system 330 further includes a second optical element 330B that is positioned along the beam path 338A between the illumination system 328 and the optical element 330A. In one embodiment, the second optical element 330B is a collimating lens that collimates the illumination beam 338 before the illumination beam 338 impinges on the optical element 330A and before the transmitted beam 347 is directed toward and impinges on the grating 318. Additionally, or in the alternative, the second optical element 330B could also be a cylindrical lens that collimates or slightly focuses the illumination beam 338 in and out of the plane of the second optical element 330B, while letting light in the plane of the page continue to expand, i.e. similar to what is shown and described in relation to FIG. 2. For a given source power, this will increase the power density on the corresponding image sensor 332 in the direction perpendicular to the direction of the image sensor 332.

In some embodiments, through use of the second optical element 330B, i.e. the collimating lens, the illumination beam 338 can have a circular cross-section. In certain such embodiments, the illumination beam 338 can have a diameter that is slightly larger than the size of each of the image sensors 332A, 332B. With such design, while the sensor head 326 may be slightly longer than in the previous embodiment, and while the image sensor assembly 316 includes an additional component as compared to the previous embodiment, the overall data processing becomes very simple. For example, all of the beam angles referred to above, i.e. the initial beam angle 242 (illustrated in FIG. 2), the measurement beam angles, $\beta_{+1}$ and $\beta_{-1}$, and the reference beam angles, $\gamma_{+1}$ and $\gamma_{-1}$, are all applicable to the entire beam. Additionally, the fringes captured by the image sensors 332A, 332B would be pure tilt fringes with a constant pitch across the sensor. Thus, the software required to process the data captured by the image sensors 332A, 332B can be much less complex. It is appreciated that a Fourier transform of the data can be used to extract the phase because the fringe pitch is constant across the image sensor 332A, 332B.

It is appreciated that because all of the angles applicable to the position encoder 218 illustrated in FIG. 2 are also applicable to the embodiment of the position encoder 318 illustrated in FIG. 3, such angles have not been repeated in FIG. 3.

Figure 4:
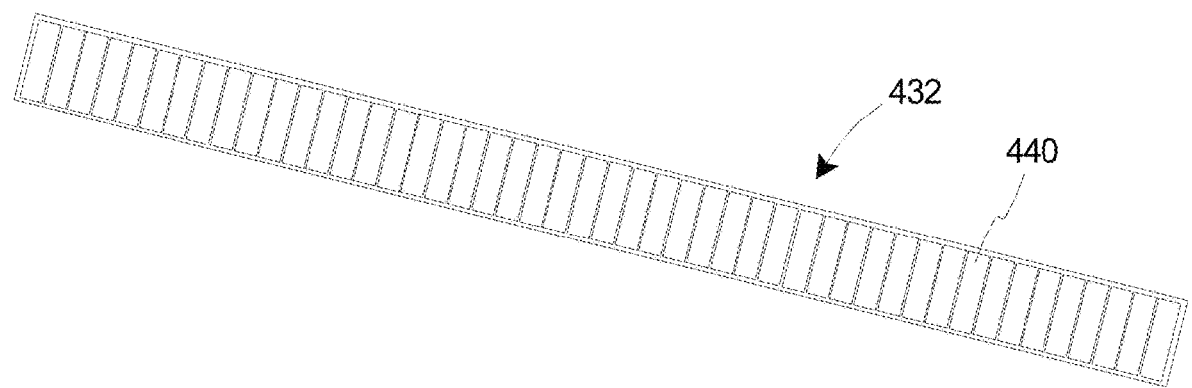
FIG. 4 is a simplified schematic illustration of an embodiment of an image sensor that is usable as part of the image sensor assembly illustrated in FIG. 1A.

FIG. 4 is a simplified schematic illustration of an embodiment of an image sensor 432 that is usable as part of the image sensor assembly 16 illustrated in FIG. 1A. More specifically, the image sensor 432 illustrated in FIG. 4 can be used as any of the first image sensors 32A, 232A, 332A (illustrated in FIGS. 1A, 2 and 3, respectively), or the second image sensors 32B, 232B, 332B (illustrated in FIGS. 1A, 2 and 3, respectively).

As illustrated, this embodiment of the image sensor 432 is a linear, one-dimensional CCD or CMOS type of image sensor that includes a one-dimensional array of detector elements 440 (or pixels). This type of image sensor 432 also produces a compact data stream and may be suitable for use in the position encoder 14. Depending on the application, as provided herein, two image sensors can be used to create a two-dimensional sensor, i.e. the system can incorporate the first image sensor 32A having a first one-dimensional array of detector elements 440 that extend in a first direction; and the second image sensor 32B having a second one-dimensional array of detector elements 440 that extend in a second direction that is different than the first direction. More particularly, as noted above, the image sensors 32A, 32B can be positioned and oriented to effectively capture or sense information from the reference beams 246A, 246B (illustrated in FIG. 2) and the measurement beams 252A, 252B (illustrated in FIG. 2).

It is appreciated that FIG. 4 merely shows a small number or array of detector elements 440 (or pixels) within the image sensor 432 for purposes of simplicity and ease of illustration. More specifically, in one embodiment, the image sensor 432 can be oriented such that the array of detector elements 440 is oriented at an angle relative to the axis, e.g., the Z axis, along which the image sensor 432 is spaced apart from the grating 18 (illustrated in FIG. 1A). It is further appreciated that a typical such one-dimensional image sensor 432 could contain a much larger number or array of detector elements 440 than what is specifically shown in FIG. 4, and no limitation is intended by what is specifically illustrated in FIG. 4. For example, in one non-exclusive alternative embodiment, the image sensor 432 can include 1,024 detector elements 440 (pixels) that are arranged in a 1×1024 one-dimensional, linear array. Additionally, in one embodiment, each pixel can be approximately 7.81 microns by 125 microns. Alternatively, the image sensor 432 can have a different design and/or the individual pixels can be of a different size.

Because the image sensor 432 collects information from the illumination beam 238 (illustrated in FIG. 2) impinging on the grating (e.g., the grating 218 illustrated in FIG. 2), the output data from the image sensor 432 can be processed by a variety of algorithms in order to find the phase of the fringe pattern, which is used to determine position. Additionally, some of the algorithms incorporated into the position encoder 14 may allow measurement of position in a direction perpendicular to the surface upon which the grating 218 is coupled or formed.

Figure 5A:
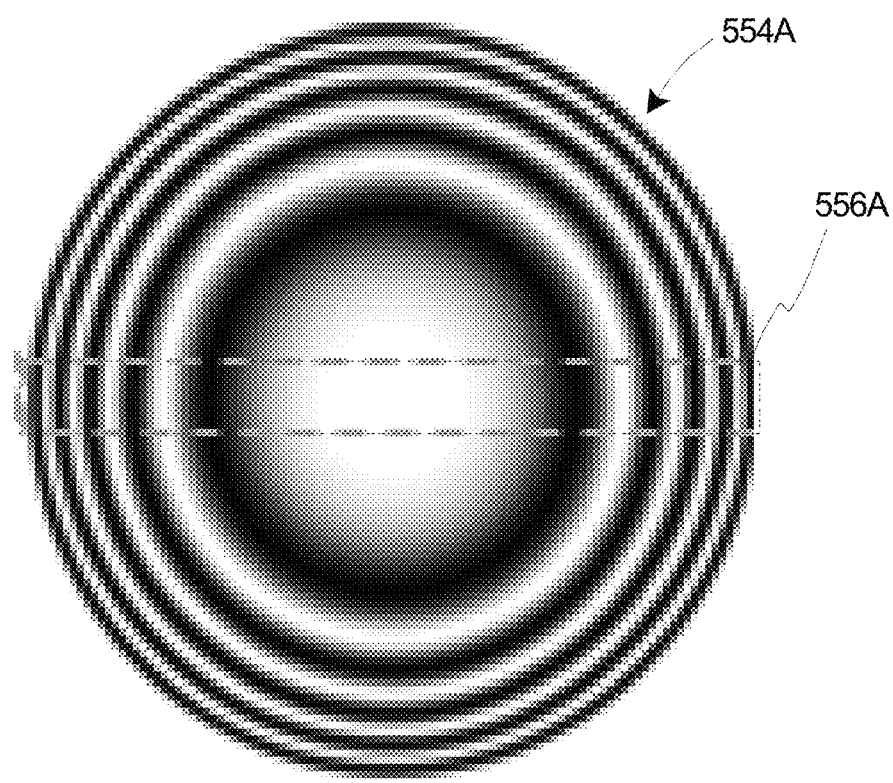
FIG. 5A is a simplified schematic illustration of fringe patterns that can be generated and captured with the position encoder illustrated in FIG. 2.

FIG. 5A is a simplified schematic illustration of fringe patterns 554A that can be captured with the position encoder 214 illustrated in FIG. 2. In particular, FIG. 5A illustrates fringe patterns 554A that can be captured by the first image sensor 232A (illustrated in FIG. 2) from the interference of the first reference beam 246A (illustrated in FIG. 2) and the first measurement beam 253A (illustrated in FIG. 2); or captured by the second image sensor 232B (illustrated in FIG. 2) from the interference of the second reference beam 246B (illustrated in FIG. 2) and the second measurement beam 253B (illustrated in FIG. 2). As shown, the fringe patterns 554A have a generally circular shape as they are generated from the substantially spherical wavefront of the illumination beam 238.

Also shown in FIG. 5A is a capture area 556A (illustrated as a dashed rectangular box) that illustrates the information, i.e. the portion of the fringe patterns 554A, that is being captured, sensed, detected and/or recorded by one of the image sensors 232A, 232B. More specifically, since the image sensor 232A, 232B in this embodiment is a one-dimensional image sensor, the capture area 556A resembles a long, narrow rectangular box. With such design, the fringe patterns 554A look more like substantially vertical fringes, with a spatially varying pitch, to the image sensor 232A, 232B.

Figure 5B:
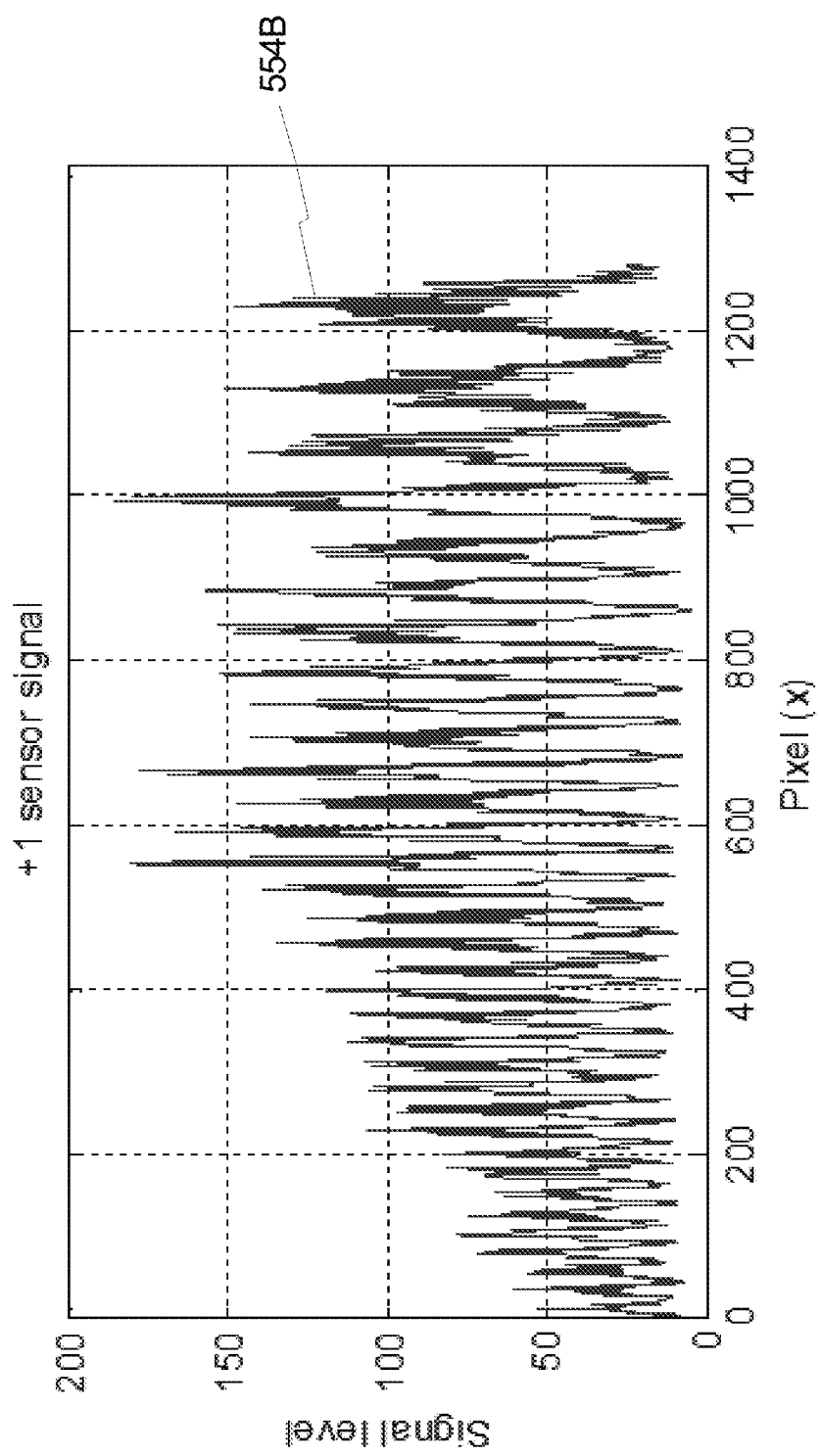
FIG. 5B is a graphical representation of actual measured fringe patterns that were captured with an image sensor substantially similar to the image sensor illustrated in FIG. 4.

FIG. 5B is a graphical representation of actual measured fringe patterns 554B, i.e. the actual measured signal level, that were captured at a moment in time with a prototype including an image sensor substantially similar to the image sensor 432 illustrated in FIG. 4. More specifically, FIG. 5B illustrates a portion of the actual measured fringe patterns that would have been captured within the capture area 556A (illustrated in FIG. 5A) at the moment in time. In FIG. 5B, each point represents the signal level at an individual pixel of the image sensor. As clearly illustrated in FIG. 5B, the fringe pitch varies across the image sensor. Additionally, in FIG. 5B, the signal level of the information captured at the individual pixel is shown along the Y axis, while the pixel of the image sensor is shown along the X axis. It is appreciated that in one embodiment, the actual measured fringe patterns illustrated in FIG. 5B can be captured with the first image sensor 32A, 232A, 332A, e.g., a +1 order image sensor. Alternatively, the actual measured fringe patterns illustrated in FIG. 5B can be captured with the second image sensor 32B, 232B, 332B, e.g., a −1 order image sensor. It is appreciated that the image sensor 432 is configured to measure fringe patterns at various (sequential) moments in time in order to continuously monitor the relative position and/or movement of the objects 10, 12 (illustrated in FIG. 1A).

Figure 5C:
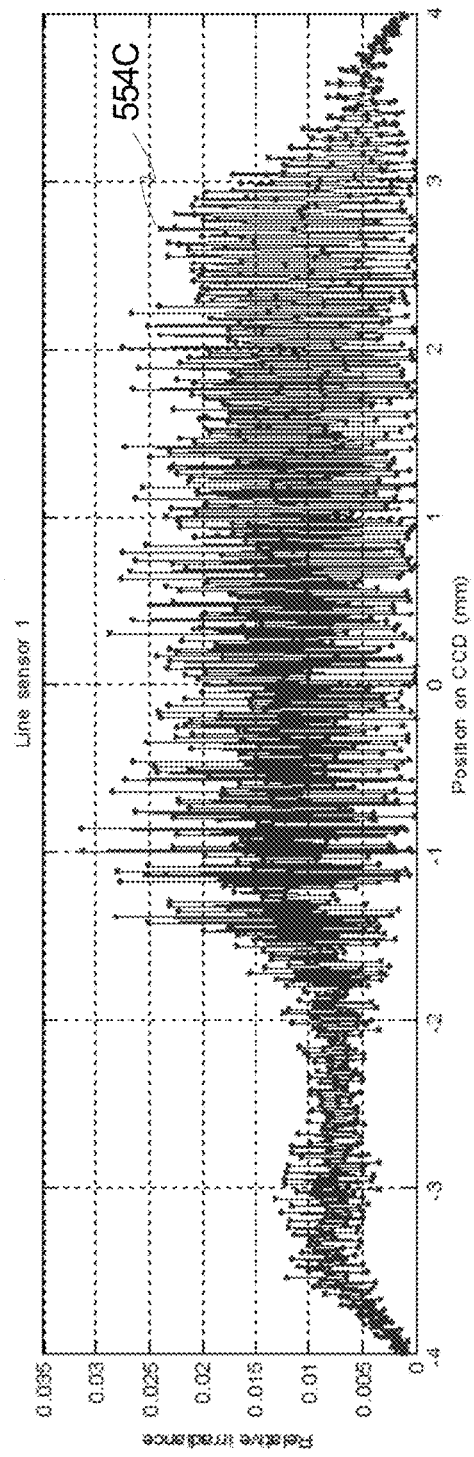
FIG. 5C is a graphical representation of simulated fringe patterns that can be captured with a first image sensor of the image sensor assembly illustrated in FIG. 1A.
Figure 5D:
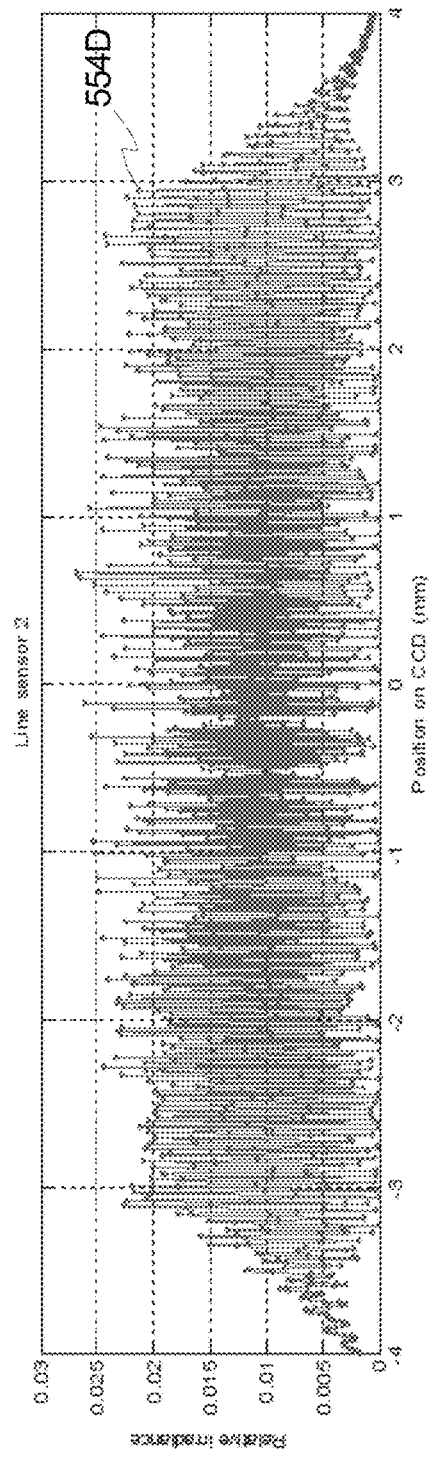
FIG. 5D is a graphical representation of alternative simulated fringe patterns that can be captured with a second image sensor of the image sensor assembly illustrated in FIG. 1A.

FIG. 5C is a graphical representation of simulated fringe patterns 554C that can be captured with the image sensor 432 illustrated in FIG. 4. In particular, FIG. 5C is a graphical representation of simulated fringe patterns 554C that can be captured with the first image sensor 232A (illustrated in FIG. 2). Additionally, FIG. 5D is a graphical representation of alternative simulated fringe patterns 554D that can be captured with the image sensor 432 illustrated in FIG. 4. More particularly, FIG. 5D is a graphical representation of simulated fringe patterns 554D that can be captured with the second image sensor 232B (illustrated in FIG. 2). In both FIGS. 5C and 5D, each dot in the Figure represents a pixel of the respective image sensor 232A, 232B. In both Figures, the relative irradiance of the information captured at the individual pixel is shown along the Y axis, while the position of the pixel on the image sensor 232A, 232B is shown along the X axis.

As expected, in each of FIG. 5C and FIG. 5D, the fringe pattern does not have a constant fringe frequency because the interfering beams are spherical wavefronts with different radii of curvature, due to their different total distances traveled after leaving the input fiber. Therefore, the software for the control system 36 (illustrated in FIG. 1) needs to accurately determine the phase of the fringe pattern.

As provided herein, the position encoder of the present invention is designed to capture position and/or movement in two degrees of freedom. For example, in certain non-exclusive applications, the phase of the fringe pattern on the two image sensors 232A, 232B depends on both the x position and the z position of the grating 218 (illustrated in FIG. 2) relative to the image sensors 232A, 232B. The x-sensitivity can be derived from the grating period on the image sensor 232A, 232B, while the z-sensitivity comes from the angle of incidence of the transmitted beam 247 (illustrated in FIG. 2) on the grating 218, the angle 251A of the +1 order diffracted beam 252A, and the angle 251B of the −1 order diffracted beam 252B. So long as the transmitted beam 247 is nearly normally incident to the grating 218, the two measurement signals, i.e. the first measurement signal from the first image sensor 232A and the second measurement signal from the second image sensor 232B, can be processed to give both the relative x position and the relative z position of the grating 218 relative to the image sensors 232A, 232B. In certain embodiments, adding the two measurement signals together can be used to give the relative z position, while the difference between the two measurement signals can give the relative x position. This is because, the +1 and −1 order diffracted beams 252A, 252B will have equal but opposite phase changes for x-grating motion, since the phase change depends on the motion of the grating only. In addition, for a transmitted beam 247 that is normally incident on the grating 218, the sensitivity to z motions will be equal and have the same sign for both measurements (using the +1 or −1 order diffracted beams 252A, 252B). Alternatively, in other applications, the measurement signals can be utilized within the position encoder to determine relative position between the grating 218 and the image sensors 232A, 232B in two alternative degrees of freedom.

As noted above, it is appreciated that stability will be affected by the position drift of the one-dimensional image sensors 232A, 232B, and also by position drift and refractive index changes of the optical element 230A (illustrated in FIG. 2), i.e. the glass wedge.

Figure 5E:
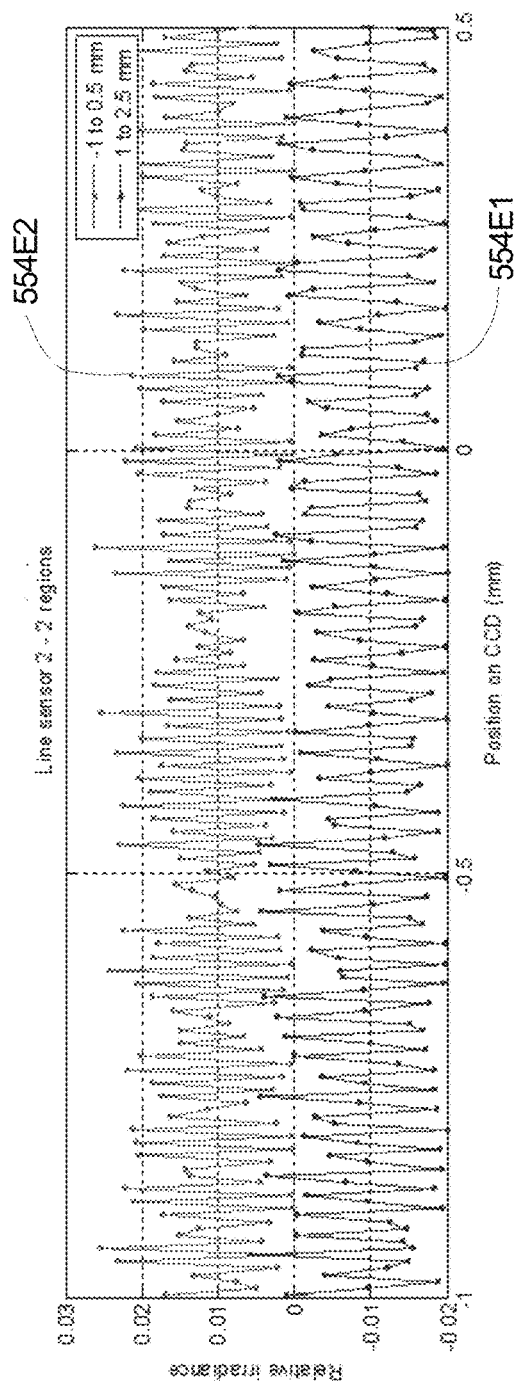
FIG. 5E is a graphical representation of portions of still other alternative simulated fringe patterns that can be captured with the image sensor illustrated in FIG. 4.

FIG. 5E is a graphical representation of portions of still other alternative simulated fringe patterns 554E1, 554E2 that can be captured with the image sensor 432 illustrated in FIG. 4. In particular, FIG. 5E illustrates the simulated fringe patterns 554E1, 554E2 at the second image sensor 232B (illustrated in FIG. 2) in greater detail, i.e. over a smaller number of pixels.

As provided herein above, it is appreciated that the initial beam angle 242 ("θ"), the wedge angle 248 ("α"), the position angle 250 ("φ"), the pitch, T, of the grating, the wavelength, λ, of the beams, and the refractive index, n, of the optical element, can be adjusted such that there would be no aliasing of the fringes. However, it is further appreciated that the design of the position encoder, as provided in detail herein, can still work effectively even in embodiments that generate aliased fringes, so long as the contrast loss due to aliasing is not too detrimental to the measurement. For example, FIG. 5E illustrates the first fringe pattern 554E1 at a place where the fringe frequency is lower, so that there is no aliasing of the first fringe pattern 554E1. However, the fringe frequency for the second fringe pattern 554E2 is greater, so there may be some aliasing of the second fringe pattern 554E2. This can occur when there is a larger angle between the beams at the second image sensor 232B, i.e. between the second reference beam 246B (illustrated in FIG. 2) and the second measurement beam 253B (illustrated in FIG. 2).

Additionally, it is understood that a Fourier transform of the data cannot be used to extract the phase because the fringe pitch varies across the image sensor 232A, 232B.

Figure 5F:
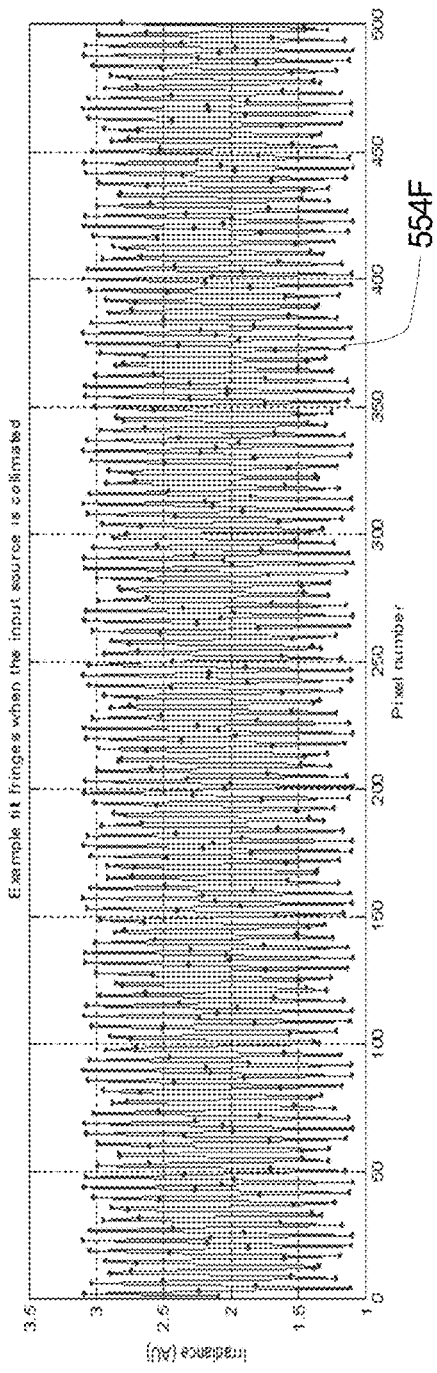
FIG. 5F is a graphical representation of yet other alternative simulated fringe patterns that can be captured with the image sensor illustrated in FIG. 4.

FIG. 5F is a graphical representation of yet other alternative simulated fringe patterns 554F that can be captured with the image sensor 432 illustrated in FIG. 4. In particular, FIG. 5F is a graphical illustration of simulated fringe patterns 554F that can be captured with the first image sensor 332A (illustrated in FIG. 3) or the second image sensor 332B (illustrated in FIG. 3), i.e. when the input illumination beam 338 (illustrated in FIG. 3) is collimated. As above, each dot in the Figure represents a pixel of the respective image sensor 332A, 332B. It is understood that FIGS. 5E and 5F are subsections of what was illustrated and described in relation to FIGS. 5C and 5D.

In summary, several key advantages are enabled by the position encoders described in detail herein that include the one-dimensional image sensors. First, the beams do not need to be collimated or parallel so long as the local tilt on the image sensor does not alias so much that contrast is lost. With 7.8 um pixels, this is quite forgiving. Second, the beams do not need to be incident on the grating twice with a retroreflection in between in order to counteract beam tilt caused by stage tilt. That tilt change will be small compared to the overall tilt already present between the measurement and reference beams. Third, some level of stray beams are tolerable in this system because they can be filtered out in software. This is because the curvature difference can be known, and fringes at other frequencies can be ignored by using the proper software. Fourth, the alignment and assembly tolerances of the system can be loose, since the resulting interference pattern will consist of high spatial frequency tilt fringes even when perfectly built; as any imperfections in fabrication will change the fringe pitch and position by only a small amount.

Figure 6:
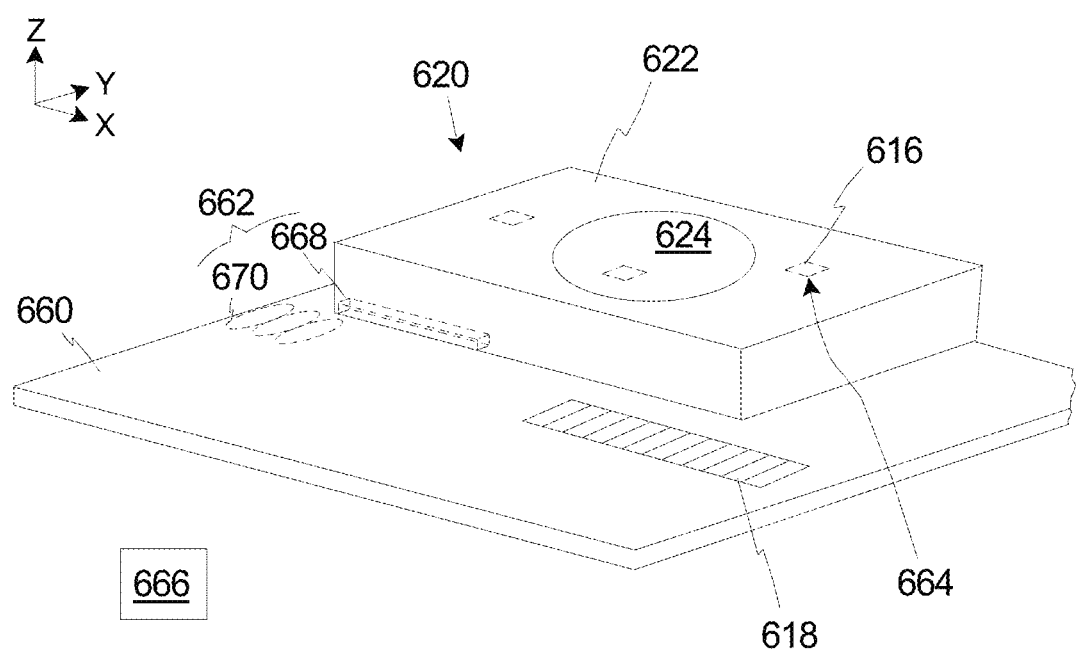
FIG. 6 is a simplified perspective view illustration of a stage assembly having features of the present invention that can utilize the position encoder.

As noted herein above, in certain applications, in addition to its potential use as a standalone position encoder, any of the embodiments of the position encoder disclosed herein can be utilized as part of a stage assembly that positions or moves a device. For example, as illustrated, FIG. 6 is a simplified perspective illustration of a stage assembly 620 that includes a base 660, a stage 622 that retains a device 624, a stage mover assembly 662 (only a portion is illustrated in phantom), a measurement system 664, and a control system 666 (illustrated as a box). As provided herein, the measurement system 664 can incorporate and/or utilize any embodiments of the position encoder illustrated and described in detail herein above.

The design of each of these components can be varied to suit the design requirements of the stage assembly 620. The stage assembly 620 is particularly useful for precisely positioning the device 624 during a manufacturing and/or an inspection process. The type of device 624 positioned and moved by the stage assembly 620 can be varied. For example, the device 624 can be a semiconductor wafer, or a reticle, and the stage assembly 620 can be used as part of an exposure apparatus for precisely positioning the wafer or the reticle during manufacturing of the semiconductor wafer. In such embodiments, the measurement system 664 can be used to provide position/movement feedback to control the stage mover assembly 662 in regions or at times when high precision is not necessary. Alternatively, for example, the stage assembly 620 can be used to move other types of devices during manufacturing and/or inspection, to move a device under an electron microscope (not shown), or to move a device during a precision measurement operation (not shown).

In the embodiment illustrated herein, the stage assembly 620 includes a single stage 622 that retains the device 624. Alternatively, for example, the stage assembly 620 can be designed to include multiple stages that are independently moved and monitored with the measurement system 664.

The base 660 is coupled to the stage mover assembly 662, receives the reaction forces generated by the stage mover assembly 662, and can be any suitable structure. In FIG. 6, the base 660 is generally rectangular-shaped and is rigid. In certain embodiments, the base 660 can be a reaction assembly that counteracts, reduces and minimizes the influence of the reaction forces from the stage mover assembly 662 on the position of other structures. For example, the base 660 can be a rigid, rectangular-shaped countermass that is maintained above a countermass support (not shown) with a reaction bearing (not shown) that allows for motion of the base 660 relative to the countermass support along the X axis, along the Y axis and about the Z axis. For example, the reaction bearing can be a vacuum preload-type fluid bearing, a magnetic-type bearing, or a roller bearing-type assembly. Alternatively, for example, the stage assembly 620 can include a reaction frame (not shown), that couples the stage mover assembly 662 to the base 660 or another structure.

With the present design, (i) movement of the stage 622 with the stage mover assembly 662 along the X axis, generates an equal and opposite X reaction force that moves the base 660 in the opposite direction along the X axis; (ii) movement of the stage 622 with the stage mover assembly 662 along the Y axis, generates an equal and opposite Y reaction force that moves the base 660 in the opposite direction along the Y axis; and (iii) movement of the stage 622 with the stage mover assembly 662 about the Z axis generates an equal and opposite theta Z reaction moment (torque) that moves the base 660 about the Z axis. Additionally, any motion of the stage 622 with respect to the base 660 when away from the center of mass of the base 660 will tend to produce a reaction moment in the Z direction on the base 660 that will tend to rotate the base 660 about the Z axis.

As noted above, the stage 622 retains the device 624. In one embodiment, the stage 622 is precisely moved by the stage mover assembly 662 to precisely position the stage 622 and the device 624. In FIG. 6, the stage 622 is generally rectangular-shaped and includes a device holder (not shown) for retaining the device 624. The device holder can be a vacuum chuck, an electrostatic chuck, or some other type of clamp.

The design of the stage mover assembly 662 can be varied to suit the movement requirements of the stage assembly 620. In the non-exclusive embodiment illustrated in FIG. 6, the stage mover assembly 662 is a planar motor that moves the stage 622 along the X, Y, and Z axes, and about the X, Y, and Z axes (six degrees of freedom). In this embodiment, the measurement system 664 monitors the movement or position of the stage 622 along the X, Y, and Z axes, and about the X, Y, and Z axes (six degrees of freedom). Alternatively, the stage mover assembly 662 can be designed to only move the stage 622 along the X and Y axes, and about Z axis (planar degrees of freedom). In such embodiment, the measurement system 664 would monitor the movement of the stage 622 along the X and Y axes, and about Z axis.

In FIG. 6, the stage mover assembly 662 is a planar motor that includes a magnet assembly 668 (only a portion is illustrated in phantom) that includes a plurality of spaced apart magnets (not shown), and a conductor assembly 670 (only a portion is illustrated in phantom) that includes a plurality of conductor units (not shown). Alternatively, for example, the stage mover assembly 662 can include one or more linear actuators, voice coil movers, or other types of actuators.

The measurement system 664 monitors the movement and/or the position of the stage 622 relative to a reference. With this information, the stage mover assembly 662 can be controlled by the control system 666 to precisely position the stage 622. The design of the measurement system 664 can be varied according to the movement requirements of the stage 622. For example, as noted above, the measurement system 664 can incorporate and/or utilize a position encoder similar to one or more of the embodiments illustrated and described above. More particularly, as shown in FIG. 6, the measurement system 662 includes a plurality of spaced apart image sensor assemblies 616 (illustrated as a box in phantom) that are fixedly attached to and/or integrated into the bottom of the stage 622, and a grating 618 (only a portion of which is shown in FIG. 6) that is secured to or formed within an upper surface of the base 660. With this design, the image sensor assemblies 616 with the stage 622 move relative to the base 660. Alternatively, in one embodiment, the grating 618 can be secured to or formed within a bottom surface of the stage 622, and the image sensor assemblies 616 can be fixedly attached to and/or integrated into the base 660.

The number and design of the image sensor assemblies 616 can vary. For example, in FIG. 6, each image sensor assembly 616 is able to monitor movement in two degrees of freedom. Thus, three or more image sensor assemblies 616 may be needed to provide monitoring of the full movement of the stage 622 along the X, Y, and Z axes, and about the X, Y, and Z axes.

The control system 666 is electrically connected to the measurement system 664, and utilizes the information from the measurement system 664 to monitor and determine movement of the stage 622. For example, the control system 666 can utilize the measurement signals from the measurement system 664 to monitor the movement of the stage 622. The control system 666 is also electrically connected to, directs and controls electrical current to the stage mover assembly 662 to precisely position the device 624. With information regarding the movement or position of the stage 622, the control system 666 can direct current to the stage mover assembly 662 so that the stage 622 follows a known, desired trajectory. The control system 666 can include one or more processors and is programmed to perform one or more of the steps provided herein.

As noted above, in certain embodiments, the accuracy of the position encoder, and the measurement signals generated therefrom may be affected by position drift of the one-dimensional image sensors. For example, the position encoder may be expected to suffer from measurement error if the image sensors or the mechanical parts they are mounted to thermally expand (e.g., along the sensor axis 232X) during operation due to heat generated by the beams on the image sensors. In such situations, the image sensors will move relative to the fringe patterns, and it will be difficult to distinguish this from a movement of the fringe pattern due to relative movement of the grating.

For example, in certain embodiments, as described in detail herein below in relation to FIGS. 7-9, the control system 36 can utilize a specially designed drift compensation algorithm that utilizes fringe pitch variation across the image sensors to enable direct measurement of sensor drift for each image sensor, and, thus, compensation for the sensor drift of each image sensor. Thus, through the use of the drift compensation algorithm, the control system 36 can remove the influence of sensor motion, i.e. position drift of each image sensor, and determine the actual phase change of the fringe pattern due to relative movement between the position encoder and the grating. Additionally, it is appreciated that application of the drift compensation algorithm, as described in detail herein, can be performed on each of the image sensors of the position encoder.

Figure 7:
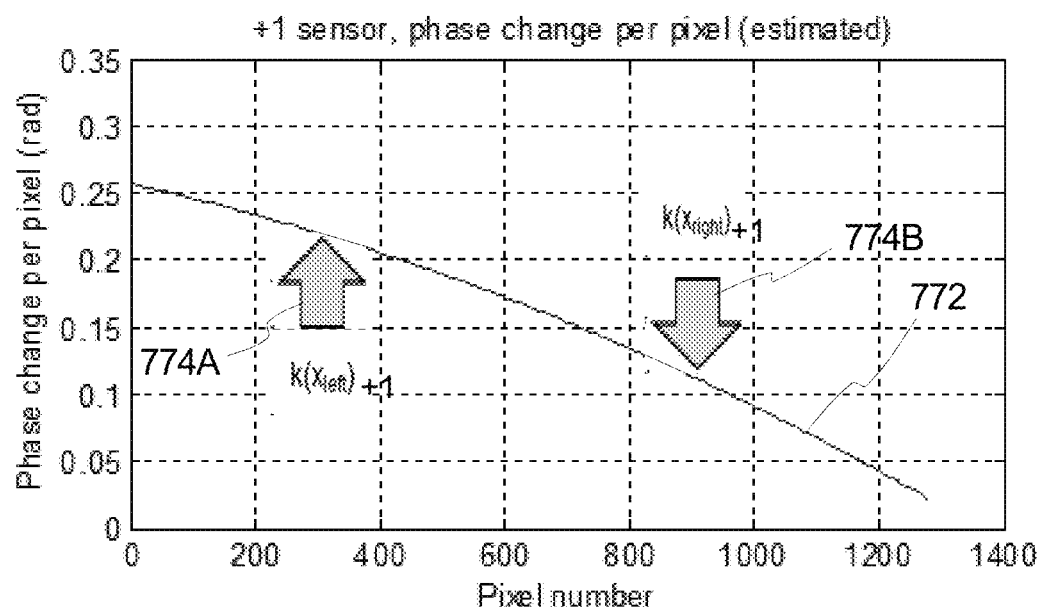
FIG. 7 is a graphical illustration of phase change per pixel of the graphical representation of the fringe patterns as illustrated in FIG. 5B.

FIG. 7 is a graphical illustration of the approximate phase change per pixel of the fringe patterns as graphically represented in FIG. 5B for the +1 image sensor. In particular, FIG. 7 illustrates a phase change curve 772 showing the phase change per pixel of actual measured fringe patterns that were measured with an image sensor, e.g., a +1 order image sensor signal, substantially similar to the image sensor 232A illustrated in FIG. 2. As illustrated, phase change per pixel, in radians, is shown along the vertical axis, and pixel number across the +1 image sensor is shown along the horizontal axis. It is appreciated that FIG. 7 illustrates the approximate phase change per pixel of the fringe patterns at a single moment in time for the +1 image sensor. Additionally, it is further appreciated that the +1 image sensor 232A is configured to measure +1 fringe patterns at various moments in time in order to continuously monitor the relative position and/or movement of the objects 10, 12 (illustrated in FIG. 1A). Subsequently, at each moment in time, the approximate phase change per pixel of the fringe patterns can be calculated and used to compensate for position drift of the image sensor 432.

It should be noted that FIG. 7 is described in relation to the +1 image sensor. However, similar data can also be calculated in relation to the −1 image sensor (e.g. the −1 image sensor 232B illustrated in FIG. 2) to compensate for position drift of the −1 image sensor.

As shown in FIG. 7, in this embodiment, the phase change per pixel is not constant across the +1 image sensor. This is because the interfering beams are spherical with different radii of curvature. Due to the spherical nature of the interfering wavefronts, it is known that the phase per pixel varies smoothly across the pixels of the image sensor. In the specific example shown in FIG. 7, the +1 phase change per pixel is decreasing from left-to-right, i.e. from approximately pixel 0 to pixel 1250. As fringe frequency is inversely proportional to fringe pitch, and fringe pitch is directly proportional to phase per pixel, fringe frequency and phase change per pixel are deterministically related mathematically. In such situations, the control system 36 (illustrated in FIG. 1A) can apply a drift compensation algorithm to compensate for any potential position drift or sensor drift relative to a local sensor axis 232X (illustrated in FIG. 2) that may occur with the +1 image sensor 232A. Stated in another manner, the problem of thermal or mechanical drift of the image sensor, e.g., the one-dimensional CCD, in the position encoder leading to position errors is solved by using the fringe pitch variation across the respective image sensor to create at least two position measurements per image sensor, i.e. via the drift compensation algorithm, which allows direct measurement of the position drift of each image sensor, and therefore, compensation for the position drift of each image sensor.

Thus, as provided herein, the use of the drift compensation algorithm can provide a correction for position drift of each image sensor (e.g., +1 image sensor and −1 image sensor) relative to the sensor axis 232X due to temperature change in the simple wedge-based encoder head. Additionally, or in the alternative, the drift compensation algorithm can be used to correct for potential position drift of one or more image sensors in any type of fringe measurement system that experiences a variable phase change per pixel and/or a variable fringe pitch across the one or more image sensors.

For purposes of applying the drift compensation algorithm, the control system 36 utilizes (i) the variation of the phase change per pixel across the +1 image sensor to create at least two position measurements for the +1 image sensor, and (ii) the variation of the phase change per pixel across the −1 image sensor to create at least two position measurements for the −1 image sensor. Stated in a more generic fashion, for each image sensor, the control system 36 utilizes the variation of the phase change per pixel across the respective image sensor to create at least two position measurements for each respective image sensor to compensate for position drift.

In particular, with reference to FIG. 7, the phase change curve 772 for the +1 image sensor can be initially divided into a plurality of sensor regions, i.e. at least two sensor regions. For example, as shown in FIG. 7, the phase change curve 772 is divided into two, +1 sensor regions, i.e. a left sensor region (illustrated generally with arrow 774A) and a right sensor region (illustrated generally with arrow 774B). In this embodiment, the phase change per pixel of the +1, left sensor region 774A can be quantified as the average phase change per pixel from approximately pixel 0 to pixel 625, and the phase change per pixel of the +1, right sensor region 774B can be quantified as the average phase change per pixel from approximately pixel 625 to pixel 1250. It is appreciated that the phase change curve 772 can be divided into any suitable number of sensor regions, two or more than two, for purposes of applying the drift compensation algorithm. Generally speaking, the greater the number of sensor regions utilized, the more accurate the drift measurement is, and thus the more accurate the true phase change can be measured (which is evidence of the relative movement of objects in x or z directions). However, the greater the number of sensor regions also increases the complexity of the drift compensation algorithm and the corresponding computational analysis. There is also a minimum number of pixels required per sensor region that limits the number of sensor regions that can be reasonably utilized.

Similarly, it should be noted that the phase change per pixel is not constant across the −1 image sensor. Thus, the drift compensation algorithm can provide a correction for position drift of the −1 image sensor due to temperature change. In particular, a −1 phase change curve (not shown) for the −1 image sensor can be generated from the −1 image sensor data, and the −1 phase change curve can be initially divided into a plurality of −1 sensor regions, i.e. at least two, −1 sensor regions. For example, the −1 phase change curve of the −1 image sensor can be divided into two, −1 sensor regions, i.e. a −1, left sensor region and a −1, right sensor region. In this embodiment, the phase change per pixel of the −1, left sensor region can be quantified as the average phase change per pixel from approximately pixel 0 to pixel 625, and the phase change per pixel of the −1, right sensor region can be quantified as the average phase change per pixel from approximately pixel 625 to pixel 1250.

It is appreciated that each sensor region 774A, 774B of each image sensor can also be referred to as a first sensor region, a second sensor region, sensor region A, and/or sensor region B.

As provided herein, the position encoder of the present invention is intended to measure relative movement between the two objects 10, 12 in the x (e.g., horizontal) and z (e.g., vertical) directions. For example, assuming no position drift of each of the image sensors, utilizing Equations 8-10 below, the measurement signals, $M_{+1}$ and $M_{-1}$, from the image sensors can be used to measure relative movement between the two objects 10, 12 in the x and z directions. In particular, by adding Equations 8 and 9 (such as shown in Equation 12 below), the x sensitivities cancel, and the z measurement value can be determined; and by subtracting Equations 8 and 9 (such as shown in Equation 11 below), the z sensitivities cancel, and the x measurement value can be determined.

Additionally, the analysis provided herein, for purposes of developing and applying the drift compensation algorithm assumes that any potential position drift of the image sensors will also be in the x and z directions. However, with the image sensors being angled relative to the X-Y plane, i.e. relative to the surface of the grating, it is appreciated that any potential position drift along respective local sensor axis of each image sensor will cause large measurement errors. Thus, to correct for position drift of the image sensors, it is desired to remove any "fake" phase change that is caused by the physical movement of the image sensors. As such, each of the measured phase values, i.e. $M_{+1}$ and $M_{-1}$, are corrected individually as provided herein.

In one embodiment, the analysis begins with the use of +1 measurement signal ($M_{+1}$) from the +1 image sensor, and the −1 measurement signal ($M_{-1}$) from the −1 image sensor. In particular, these equations relate to the signal on the image sensors, $M_{+1}$ and $M_{-1}$, where the +1 and −1 indicate which diffraction order being used from the grating.

$$M_{+1} = x\frac{2\pi}{T} + Az \qquad \text{(Equation 8)}$$

$$M_{-1} = -x\frac{2\pi}{T} + Az \qquad \text{(Equation 9)}$$

$$A = 1 + \cos\left(\sin^{-1}\left(\frac{\lambda}{T}\right)\right) \qquad \text{(Equation 10)}$$

Equations 8 and 9 show the relationships between the measured signals ($M_{+1}$ and $M_{-1}$) of the +1 and −1 image sensors, respectively, and the x and z relative positions. In Equation 8-10, A is the sensitivity to z motion, which is a function of wavelength of the measurement light λ, and the grating pitch T of the diffraction grating. Further, x is the relative positon of the second object 12 along the X axis and z is the relative position of the second object along the Z axis. Further, the measured signals are in units of radians of phase of the fringe pattern on the respective image sensor. The key point is that the phase of the fringe pattern on each image sensor is dependent on both x and z position of the grating mounted to the second object 12 (illustrated in FIG. 1), e.g., the base 660 (illustrated in FIG. 6).

Next, Equations 9 and 10 can be rewritten to solve for x and z as provided below. Stated in another fashion, movement in the x direction and the z direction can then be calculated as follows:

$$x = (M_{+1} - M_{-1})\frac{T}{4\pi} \qquad \text{(Equation 11)}$$

$$z = \frac{(M_{+1} + M_{-1})\frac{T}{4\pi}}{2 \cdot A}. \qquad \text{(Equation 12)}$$

In the Equations 8-12, it is assumed that no position drift has occurred for each image sensor. Stated in another fashion, the calculations of x and z relative positions in Equations 11 and 12 assume that the values for $M_{+1}$ and $M_{-1}$ are accurate, with no position drift of each image sensor having occurred.

It should be noted that if there is significant sensor drift, the calculations of x and z using Equations 11 and 12 will not be accurate. Thus, the present invention provides a drift compensation algorithm to compensate and correct for the sensor drift of each individual sensor.

As provided above, the graphical representation of one, +1 fringe pattern is illustrated in FIG. 5B. As provided herein, a fringe pattern on an image sensor will appear to shift position as the phase of the fringe pattern changes. In the absence of sensor drift, the phase of the fringes changes everywhere at the same rate with respect to motion in x or z. If the respective image sensor moves, e.g., drifts, the entire fringe pattern moves by the same position everywhere. Additionally, if the fringe pattern had a constant fringe pitch everywhere (i.e. same phase per pixel across the image sensor), then phase change and sensor motion would be indistinguishable from one another. However, if the fringe pitch changes across the image sensor, then the phase change (illustrated in FIG. 7) and the position drift of the image sensor can both be determined from a signal such as shown in FIG. 5B.

FIG. 7 and the associated equations set forth in detail below effectively illustrate development and implementation of the drift compensation algorithm for each image sensor. As noted, it is appreciated that the drift compensation algorithm will be implemented for each image sensor of the position encoder, i.e. the +1 image sensor that generates $M_{+1}$ and the −1 image sensor that generates $M_{-1}$.

In development of the drift compensation algorithm, it is appreciated that k(x) is the phase change (in radians) per pixel at each location across the image sensor. Thus, as shown in FIG. 7, $k(x_{left+1})$ is the average phase change (in radians) per pixel in the left sensor region 774A for the +1 image sensor, and $k(x_{right+1})$ is the average phase change (in radians) per pixel in the right sensor region 774B of the +1 image sensor. Additionally, as illustrated, the average phase change per pixel for the +1 left sensor region 774A is different than the average phase change per pixel for the +1 right sensor region 774B. Further, as provided herein, the average phase change per pixel for the +1 left sensor region 774A and the average phase change per pixel for the +1 right sensor region 774B are utilized by the control system 36 to calculate position drift of the +1 image sensor. Somewhat similarly, the average phase change per pixel for the −1 left sensor region, and the average phase change per pixel for the −1 right sensor region can be utilized by the control system 36 to calculate position drift of the −1 image sensor.

Subsequently, a +1 left measured phase, $\omega_{m,left+1}$, in the +1 left sensor region 774A, and a +1 right measured phase, $\omega_{m,right+1}$, in the +1 right sensor region 774B can then be used to find position drift of the +1 image sensor, $\Delta x_{+1}$, which would otherwise cause a measurement error, as follows:

$$\omega_{m,left+1} = \omega_{real+1} + \Delta x_{+1} * k(x_{left+1})/P_{+1} \quad \text{(Equation 13)}$$

$$\omega_{m,right+1} = \omega_{real+1} + \Delta x_{+1} * k(x_{right+1})/P_{+1} \quad \text{(Equation 14)}$$

$$\Delta x_{+1} = P_{+1} * \frac{\omega_{m,left+1} - \omega_{m,right+1}}{k(x_{left+1}) - k(x_{right+1})} \quad \text{(Equation 15)}$$

$$\omega_{real+1} = \omega_{m,right+1} - \Delta x_{+1} * k(x_{right+1})/P_{+1} = \quad \text{(Equation 16)}$$
$$\omega_{m,left+1} - \Delta x_{+1} * k(x_{left+1})/P_{+1}$$

In these equations and elsewhere, $\omega_{m,left+1}$ is the measured phase of the fringes for the +1 left sensor region in radians of the +1 image sensor, which can be calculated using a standard fringe processing algorithm, such as Least Squares Phase Shifting Interferometry (LSPSI) algorithms or other algorithms which are well understood in the art. Further, $\omega_{m,right+1}$ is the measured phase for the +1 right sensor region in radians of the +1 image sensor, calculated in a similar manner as described above. Moreover, $\Delta x_{+1}$ is the sensor position change of the +1 image sensor, e.g., in microns, (also sometimes referred to as $\Delta x_{s+1}$, as the sensor position change, i.e. the position drift or sensor drift, can be measured relative to any sensor axis). Additionally, $P_{+1}$ is pixel size, e.g., in microns per pixel for the +1 image sensor, and $\omega_{real+1}$ is the actual phase change in radians of the +1 image sensor due to relative movement of the grating in x or z directions.

Stated in another manner, Equation 15 demonstrates that the drift compensation algorithm, as applied by the control system 36, calculates position drift of the +1 image sensor as a difference between the measured phase for the +1 left sensor region and the measured phase for the +1 right sensor region, divided by the difference between the average phase change per pixel for the +1 left sensor region and the average phase change per pixel for the +1 right sensor region. Additionally, Equation 16 demonstrates that the drift compensation algorithm, as applied by the control system 36, calculates an actual phase change for the +1 image sensor due only to relative motions of the grating in x and z as (i) a difference between the measured phase for the +1 left sensor region, and a product of the position drift of the +1 image sensor and the average phase change per pixel for the +1 left sensor region; and/or (ii) a difference between the measured phase for the +1 right sensor region, and a product of the position drift of the +1 image sensor and the average phase change per pixel for the +1 right sensor region.

It is appreciated that the equations shown here are for two defined regions on the +1 image sensor. However, as noted above, the drift compensation algorithm can also be applied with more defined regions on the +1 image sensor.

Additionally, Equation 15 solving for $\Delta x_{+1}$ (or $\Delta x_{s+1}$) shows the importance of having a large difference in the $k(x)+1$ values. In particular, if the difference in $k(x)+1$ values is too small, then the calculation includes dividing by approximately zero. Another way to understand the equation that solves for $\Delta x_{s+1}$ is that the measured phases, $\omega_{m,left+1}$ and $\omega_{m,right+1}$ should be equal if $\Delta x_{s+1}$ is zero, that is, any difference in measured fringe phase between $\omega_{m,left+1}$ and $\omega_{m,right+1}$ is due to the sensor motion.

The actual phase change on the +1 image sensor due to movement in the x or z directions can then be calculated by removing the influence of the sensor motion $\Delta x_{+1}$, as follows:

$$\omega_{real+1} = \omega_{m,left+1} - \Delta x_{+1} \cdot k(x_{left+1}) \quad \text{(Equation 17)}$$

$$\omega_{real+1} = \omega_{m,right+1} - \Delta x_{+1} \cdot k(x_{right+1}) \quad \text{(Equation 18)}$$

Thus, $\omega_{real+1}$ corresponds to the value $M_{+1}$ after correcting for position drift $\Delta x_{s+1}$ of the +1 image sensor. Stated in another manner, $\omega_{real+1}$ is the corrected $M_{+1}$ value. It should be noted that both $\omega_{real+1}$ and $M_{+1}$ are in units of radians of fringe phase.

As provided above, similar calculations can be performed on each additional image sensor to compensate for the sensor drift of each image sensor. For example, to compensate for the sensor drift of the −1 image sensor, similar calculations can be made for the −1 image sensor to determine the $\omega_{real-1}$ of the −1 image sensor.

First, the average phase change (in radians) per pixel $k(x_{left-1})$ in the left sensor region for the −1 image sensor, and the average phase change (in radians) per pixel $k(x_{right-1})$ in the right sensor region of the −1 image sensor are calculated using the −1 sensor, phase change per pixel graph (not shown, but somewhat similar to FIG. 7).

Subsequently, a −1 left measured phase, $\omega_{m,left-1}$, in the −1 left sensor region and a −1 right measured phase, $\omega_{m,right-1}$, in the −1 right sensor region can then be used to find position drift of the −1 image sensor, $\Delta x_{-1}$, which would otherwise cause of measurement error, as follows:

$$\omega_{m,left-1} = \omega_{real-1} + \Delta x_{-1} * k(x_{left-1})/P_{-1} \quad \text{(Equation 19)}$$

$$\omega_{m,right-1} = \omega_{real-1} + \Delta x_{-1} * k(x_{right-1})/P_{-1} \quad \text{(Equation 20)}$$

$$\Delta x_{-1} = P_{-1} * \frac{\omega_{m,left-1} - \omega_{m,right-1}}{k(x_{left-1}) - k(x_{right-1})} \quad \text{(Equation 21)}$$

$$\omega_{real-1} = \omega_{m,right-1} - \Delta x_{-1} * k(x_{right-1})/P_{-1} = \quad \text{(Equation 22)}$$
$$\omega_{m,left-1} - \Delta x_{-1} * k(x_{left-1})/P_{-1}$$

In these equations and elsewhere, $\omega_{m,left-1}$ is the measured phase of the fringes for the −1 left sensor region in radians of the −1 image sensor, which can be calculated using a standard fringe processing algorithm, such as Least Squares Phase Shifting Interferometry (LSPSI) algorithms or other algorithms which are well understood in the art. Further, $\omega_{m,right-1}$ is the measured phase for the −1 right sensor region in radians of the −1 image sensor, calculated in a similar manner as described above. Moreover, $\Delta x_{-1}$ is the sensor position change of the −1 image sensor, e.g., in microns, (also sometimes referred to as $\Delta x_{s-1}$, as the sensor position change, i.e. the position drift or sensor drift, can be measured relative to any sensor axis). Additionally, $P_{-1}$ is pixel size, e.g., in microns per pixel for the −1 image sensor, and $\omega_{real-1}$ is the actual phase change in radians of the −1 image sensor due to relative movement of the grating in x or z directions.

Stated in another manner, Equation 21 demonstrates that the drift compensation algorithm, as applied by the control system 36, calculates position drift of the −1 image sensor as a difference between the measured phase for the −1 left sensor region and the measured phase for the −1 right sensor region, divided by the difference between the average phase change per pixel for the −1 left sensor region and the average phase change per pixel for the −1 right sensor region. Additionally, Equation 22 demonstrates that the drift compensation algorithm, as applied by the control system 36, calculates an actual phase change for the −1 image sensor due only to relative motions of the grating in x and z as (i) a difference between the measured phase for the −1 left sensor region, and a product of the position drift of the −1 image sensor and the average phase change per pixel for the −1 left sensor region; and/or (ii) a difference between the measured phase for the −1 right sensor region, and a product of the position drift of the −1 image sensor and the average phase change per pixel for the −1 right sensor region.

It is appreciated that the equations shown here are for two defined regions on the −1 image sensor. However, as noted above, the drift compensation algorithm can also be applied with more defined regions on the −1 image sensor.

Additionally, Equation 21 solving for $\Delta x_{-1}$ (or $\Delta x_{s-1}$) shows the importance of having a large difference in the $k(x)-1$ values. In particular, if the difference in $k(x)-1$ values is too small, then the calculation includes dividing by approximately zero. Another way to understand the equation that solves for $\Delta x_{s-1}$ is that the measured phases, $\omega_{m,left-1}$ and $\omega_{m,right-1}$ should be equal if $\Delta x_{s-1}$ is zero, that is, any difference in measured fringe phase between $\omega_{m,left-1}$ and $\omega_{m,right-1}$ is due to the sensor motion.

The actual phase change on the −1 image sensor due to movement in the x or z directions can then be calculated by removing the influence of the sensor motion $\Delta x-1$, as follows:

$$\omega_{real-1} = \omega_{m,left-1} - \Delta x_{-1} \cdot k(x_{left-1}) \quad \text{(Equation 23)}$$

$$\omega_{real-1} = \omega_{m,right-1} - \Delta x_{-1} \cdot k(x_{right-1}) \quad \text{(Equation 24)}$$

Thus, $\omega_{real-1}$ corresponds to the value $M_{-1}$ after correcting for position drift $\Delta x_{s-1}$ of the −1 image sensor. Stated in another manner, $\omega_{real-1}$ is the corrected $M_{-1}$ value. It should be noted that both $\omega_{real-1}$ and $M_{-1}$ are in units of radians of fringe phase.

Accordingly, actual or real relative movement in the x or z directions, after position drift compensation, i.e., $x_{real}$ and $z_{real}$, can be calculated by substituting in values for $\omega_{real+1}$, and $\omega_{real-1}$ for $M_{+1}$ and $M_{-1}$ in Equations 11 and 12. More specifically:

$$Xr = (\omega_{real+1} - \omega_{real-1})\frac{T}{4\pi} \quad \text{(Equation 25)}$$

$$Zr = \frac{(\omega_{real+1} + \omega_{real-1})\frac{T}{4\pi}}{2 \cdot A} \quad \text{(Equation 26)}$$

In these equations, (i) Xr is the real relative movement along the X axis after correction for position drift, and (ii) Zr is the real relative movement along the Z axis after correction for position drift.

It should be noted that to monitor position over time, for each measurement time, (i) the +1 measurement signal ($M_{+1}$) from the +1 image sensor is obtained and used to calculate the corresponding +1 actual phase change ($\omega_{real+1}$); (ii) the −1 measurement signal ($M_{-1}$) from the −1 image sensor is obtained and used to calculate the corresponding −1 actual phase change ($\omega_{real-1}$); and (iii) the real relative movement (Xr and Zr) can be calculated using the actual phase changes ($\omega_{real+1}$ and $\omega_{real-1}$). Stated more generically, for each measurement time, (i) the measurement signal (M) from each image sensor is obtained and used to calculate the corresponding actual phase change ($\omega_{real}$) for that image sensor; and (ii) the real relative movement (Xr and Zr) can be calculated using the actual phase changes ($\omega_{real}$) from the image sensors.

Figure 8A:
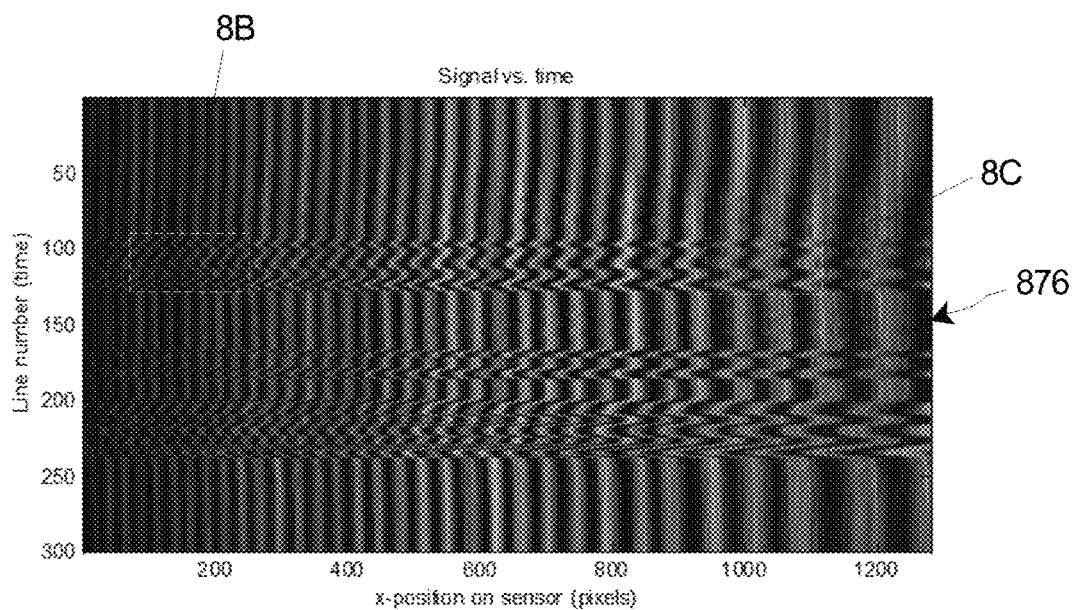
FIG. 8A is an illustration of a portion of an experimental signal showing fringe patterns as a function of time that was generated from an image sensor substantially similar to the image sensor illustrated in FIG. 4.

FIG. 8A is an illustration of a portion of an experimental signal, i.e. a fringe pattern 876, as a function of time that was generated from an image sensor substantially similar to the image sensor illustrated in FIG. 4. In FIG. 8A, the x position, or pixel number, on the image sensor is along the X axis, and time (line number) is shown along the Y axis. For purposes of generating the experimental signal 876, the image sensor used within the experiment was pushed at around approximately line number 95. Thus, movement of the image sensor is indicated with the shift in the fringe pattern starting at approximately line number 95.

Figures 8B, 8C:
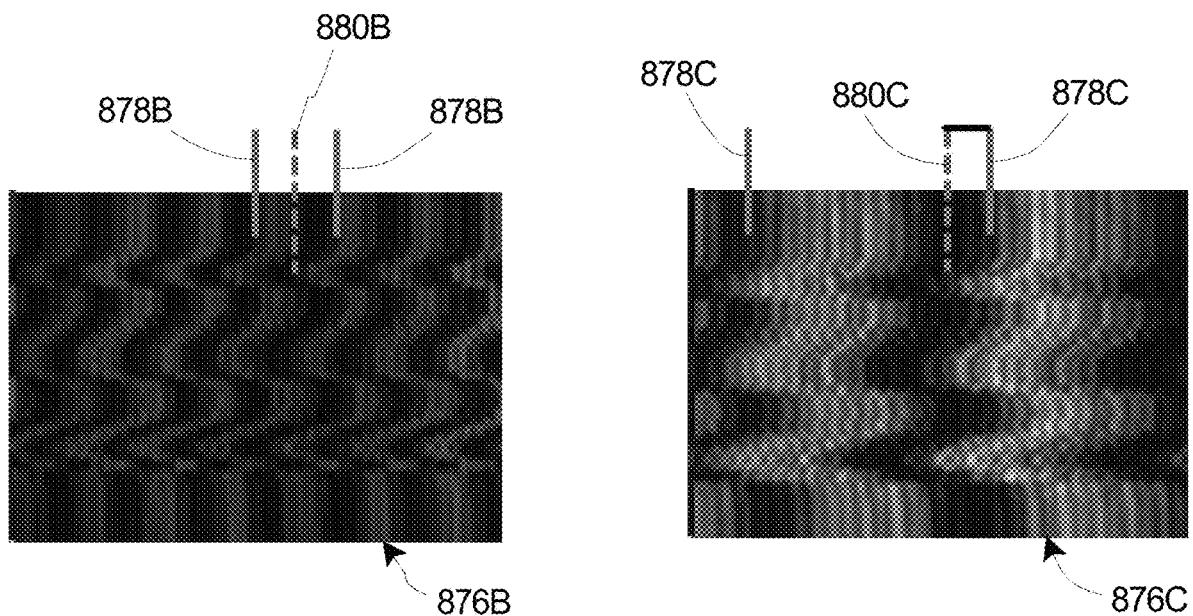
FIG. 8B is an enlarged view of a portion of the experimental signal as indicated by dashed box 8B in FIG. 8A.
FIG. 8C is an enlarged view of another portion of the experimental signal as indicated by dashed box 8C in FIG. 8A.

FIG. 8B is an enlarged view of a portion of the experimental signal, i.e. left side fringe pattern 876B, as indicated by dashed box 8B in FIG. 8A. Additionally, FIG. 8C is an enlarged view of another portion of the experimental signal, i.e. right side fringe pattern 876C, as indicated by dashed box 8C in FIG. 8A. Comparing the left side fringe pattern 876B and the right side fringe pattern 876C, it is quite clear how the phase change of the left side fringe pattern 876B and the right side fringe pattern 876C are quite different. The two solid lines 878B in FIG. 8B represent the full fringe period, while the dashed line 880B is the distance the fringe moves relative to the right-most of the two solid lines 878B. Similarly, the two solid lines 878C in FIG. 8C represent the full fringe period, while the dashed line 880C is the distance the fringe moves relative to the right-most of the two solid lines 878C. For the left side fringe pattern 876B shown in FIG. 8B, the phase change is about half of a period, or π radians. However, for the right side fringe pattern 876C shown in FIG. 8C, the phase change is about ⅕ of a period, or 2π/5 radians. As clearly shown in FIGS. 8A-8C, the phase changes on the left and on the right are different when the image sensor moves because the k(x) values are different.

Figure 9:
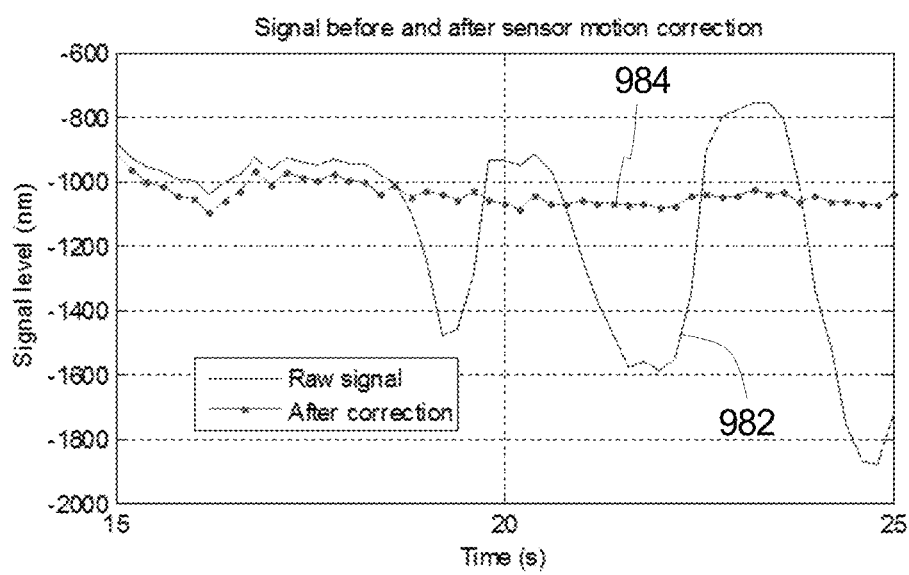
FIG. 9 is a graphical illustration of a portion of an experimental signal as a function of time that was generated from an image sensor substantially similar to the image sensor illustrated in FIG. 4, both before and after compensation for position drift of the image sensor.

FIG. 9 is a graphical illustration of a portion of an experimental signal as a function of time that was generated from an image sensor substantially similar to the image sensor illustrated in FIG. 4, both before and after compensation for position drift of the image sensor. In particular, FIG. 9 illustrates a raw measured position signal 982 (also referred to herein as a "raw signal", proportional to M in Equations 8 and 9) and a corrected position signal 984 (also referred to herein as a "corrected signal", proportional to $\omega_{real}$, in Equations 17 and 18) as a function of time, with the signal level (in nanometers) shown along the Y axis, and time (in seconds) shown along the X axis.

More specifically, interpreting the data according to FIG. 7 gives the result shown in FIG. 9. The raw signal 982 is the raw phase, $M_{+1}$, without making any corrections. Additionally, the corrected signal 984 is $\omega_{real}$, after making the $\Delta x_s$ drift correction. Note that for time 15 to 17 seconds, there appears to have been actual grating motion, whereas the changes from t=18 seconds to 25 seconds appear to be a result of position drift of the image sensor.

It is understood that although a number of different embodiments of the position encoder 14 have been illustrated and described herein, one or more features of any one embodiment can be combined with one or more features of one or more of the other embodiments, provided that such combination satisfies the intent of the present invention.

While a number of exemplary aspects and embodiments of a position encoder 14 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A position encoder for monitoring relative movement between a first object and a second object, the position encoder comprising:

a grating that is coupled to the first object; and
an image sensor assembly that is coupled to the second object, the image sensor assembly including a first image sensor; a second image sensor that is spaced apart from the first image sensor; an optical element that includes a first optical surface and a second optical surface that is spaced apart from the first optical surface; and an illumination system that directs an illumination beam at the first optical surface of the optical element to create (i) a first reference beam that is a first portion of the illumination beam that is reflected by the first optical surface and directed at the first image sensor, (ii) a first transmitted beam that is a second portion of the illumination beam that is transmitted through the first optical surface and directed at the second optical surface, (iii) a second reference beam that is a first portion of the first transmitted beam that is reflected by the second optical surface and directed at the second image sensor, and (iv) a second transmitted beam that is a second portion of the first transmitted beam that is transmitted through the second optical surface of the optical element and is directed at and impinges on the grating to create a first measurement beam that is diffracted by the grating and directed at the first image sensor, and a second measurement beam that is diffracted by the grating and directed at the second image sensor.

2. The position encoder of claim 1 wherein the grating is a one-dimensional diffraction grating such that the first measurement beam is a +1 order first measurement beam, and the second measurement beam is a −1 order second measurement beam.

3. The position encoder of claim 1 wherein the first reference beam and the first measurement beam are interfered at the first image sensor to generate a first measurement signal; and wherein the second reference beam and the second measurement beam are interfered at the second image sensor to generate a second measurement signal.

4. The position encoder of claim 3 further comprising a control system that receives the first measurement signal and the second measurement signal, the control system monitoring the relative movement between the first object and the second object based at least in part on the first measurement signal and the second measurement signal.

5. The position encoder of claim 4 wherein the control system applies a drift compensation algorithm to the first measurement signal to compensate for position drift of the first image sensor, and applies the drift compensation algorithm to the second measurement signal to compensate for position drift of the second image sensor.

6. The position encoder of claim 1 wherein the illumination system includes a laser diode that launches the illumination beam into free space toward the optical element.

7. The position encoder of claim 1 wherein the transmitted beam impinging on the grating is approximately normally incident on the grating.

8. The position encoder of claim 1 wherein each of the first image sensor and the second image sensor includes a one-dimensional array of detector elements.

9. A stage assembly including a stage that retains a device, a base that supports the stage, and the position encoder of claim 1 that monitors movement of the device relative to the base.

10. The position encoder of claim 1 wherein the first measurement beam that is diffracted by the grating is transmitted back though the second optical surface and the first optical surface of the optical element and is then directed toward the first image sensor; and wherein the second measurement beam that is diffracted by the grating is transmitted back through the second optical surface and the first optical surface of the optical element and is then directed toward the second image sensor.

11. The position encoder of claim 1 wherein the illumination system includes a single illumination source fiber that directs the illumination beam at the optical element.

12. The position encoder of claim 1 wherein the illumination system directs the illumination beam having a substantially spherical wavefront to the first optical surface of the optical element.

13. The position encoder of claim 1 wherein the optical element is substantially wedge-shaped.

14. The position encoder of claim 1 wherein at least one of the first optical surface and the second optical surface is a substantially curved surface.

15. The position encoder of claim 1 wherein at least one of the first optical surface and the second optical surface is a substantially planar surface.

16. The position encoder of claim 1 wherein the second transmitted beam is directed at and impinges on the grating in a single pass to create the first measurement beam and the second measurement beam.

17. A position encoder for monitoring relative movement between a first object and a second object, the position encoder comprising:
a grating that is coupled to the first object; and
an image sensor assembly that is coupled to the second object, the image sensor assembly including a first image sensor; a second image sensor that is spaced apart from the first image sensor; an optical element that includes a first optical surface and a second optical surface that is spaced apart from the first optical surface; and an illumination system that directs an illumination beam at the optical element to create (i) a first reference beam that is reflected by the first optical surface and directed at the first image sensor, (ii) a second reference beam that is reflected by the second optical surface and directed at the second image sensor, and (iii) a transmitted beam that is transmitted through the optical element and is directed at and impinges on the grating to create a first measurement beam that is diffracted by the grating and directed at the first image sensor, and a second measurement beam that is diffracted by the grating and directed at the second image sensor;
wherein the optical element is substantially wedge-shaped; and
wherein the first optical surface is at a wedge angle relative to the second optical surface of between approximately five degrees and thirty degrees.

18. The position encoder of claim 17 wherein the first optical surface of the optical element is positioned at a position angle of between approximately zero degrees and fifteen degrees relative to a horizontal plane that is substantially parallel to a plane of the grating.

19. A position encoder for monitoring relative movement between a first object and a second object, the position encoder comprising:
a grating that is coupled to the first object; and
an image sensor assembly that is coupled to the second object, the image sensor assembly including a first image sensor; a second image sensor that is spaced apart from the first image sensor; an optical element that includes a first optical surface and a second optical surface that is spaced apart from the first optical surface; and an illumination system that directs an illumination beam at the optical element to create (i) a first reference beam that is reflected by the first optical surface and directed at the first image sensor, (ii) a second reference beam that is reflected by the second optical surface and directed at the second image sensor, and (iii) a transmitted beam that is transmitted through the optical element and is directed at and impinges on the grating to create a first measurement beam that is diffracted by the grating and directed at the first image sensor, and a second measurement beam that is diffracted by the grating and directed at the second image sensor;

wherein the illumination system includes a single illumination source fiber that launches the illumination beam toward the optical element, and wherein the illumination source fiber launches the illumination beam toward the optical element at an initial beam angle of between approximately two degrees and fifteen degrees relative to an axis that is orthogonal to a plane of the grating.

20. A method for monitoring relative movement between a first object and a second object, the method comprising the steps of:

coupling a grating to the first object;
coupling an image sensor assembly to the second object, the image sensor assembly including a first image sensor; a second image sensor that is spaced apart from the first image sensor; an optical element that includes a first optical surface and a second optical surface that is spaced apart from the first optical surface; and an illumination system; and
directing an illumination beam at the first optical surface of the optical element with the illumination system to create (i) a first reference beam that is a first portion of the illumination beam that is reflected by the first optical surface and directed at the first image sensor, (ii) a first transmitted beam that is a second portion of the illumination beam that is transmitted through the first optical surface and directed at the second optical surface, (iii) a second reference beam that is a first portion of the first transmitted beam that is reflected by the second optical surface and directed at the second image sensor, and (iv) a second transmitted beam that is a second portion of the first transmitted beam that is transmitted through the second optical surface of the optical element and is directed at and impinges on the grating to create a first measurement beam that is diffracted by the grating and directed at the first image sensor, and a second measurement beam that is diffracted by the grating and directed at the second image sensor.

21. The method of claim 20 wherein the step of coupling the grating includes the grating being a one-dimensional diffraction grating; and wherein the step of directing includes the first measurement beam being a +1 order first measurement beam, and the second measurement beam being a −1 order second measurement beam.

22. The method of claim 20 further comprising the steps of interfering the first reference beam and the first measurement beam at the first image sensor to generate a first measurement signal; and interfering the second reference beam and the second measurement beam at the second image sensor to generate a second measurement signal.

23. The method of claim 22 further comprising the steps of receiving the first measurement signal and the second measurement signal with a control system; and monitoring the relative movement between the first object and the second object with the control system based at least in part on the first measurement signal and the second measurement signal.

24. The method of claim 23 further comprising the steps of applying a drift compensation algorithm to the first measurement with the control system to compensate for position drift of the first image sensor; and applying the drift compensation algorithm to the second measurement signal with the control system to compensate for position drift of the second image sensor.

25. The method of claim 20 wherein the step of coupling the image sensor assembly includes the illumination system including a single illumination source fiber; wherein the step of directing includes launching the illumination beam toward the optical element with the illumination source fiber at an initial beam angle of between approximately two degrees and fifteen degrees relative to an axis that is orthogonal to a plane of the grating; and wherein the step of directing further includes the transmitted beam impinging on the grating being approximately normally incident on the grating.

26. The method of claim 20 wherein the step of coupling the image sensor assembly includes each of the first image sensor and the second image sensor including a one-dimensional array of detector elements.

27. A method for monitoring relative movement between a first object and a second object, the method comprising the steps of:

coupling a grating to the first object;
coupling an image sensor assembly to the second object, the image sensor assembly including a first image sensor; a second image sensor that is spaced apart from the first image sensor; an optical element that includes a first optical surface and a second optical surface that is spaced apart from the first optical surface; and an illumination system; and
directing an illumination beam at the optical element with the illumination system to create (i) a first reference beam that is reflected by the first optical surface and directed at the first image sensor, (ii) a second reference beam that is reflected by the second optical surface and directed at the second image sensor, and (iii) a transmitted beam that is transmitted through the optical element and is directed at and impinges on the grating to create a first measurement beam that is diffracted by the grating and directed at the first image sensor, and a second measurement beam that is diffracted by the grating and directed at the second image sensor; and
wherein the step of coupling the image sensor assembly includes the optical element being substantially wedge-shaped, with the first optical surface being at a wedge angle relative to the second optical surface of between approximately five degrees and thirty degrees.

28. The method of claim 27 wherein the step of coupling the image sensor assembly includes the first optical surface of the optical element being positioned at a position angle of between approximately zero degrees and fifteen degrees relative to a horizontal plane that is substantially parallel to a plane of the grating.

29. A position encoder for monitoring relative movement between a first object and a second object, the position encoder comprising:

a grating that is coupled to the first object; and
an image sensor assembly that is coupled to the second object, the image sensor assembly including a first image sensor; a second image sensor that is spaced apart from the first image sensor; an optical element that includes a first optical surface and a second optical surface that is spaced apart from the first optical surface; and an illumination system that directs an illumination beam at the optical element to create (i) a first reference beam that is reflected by the first optical surface and directed at the first image sensor, (ii) a second reference beam that is reflected by the second optical surface and directed at the second image sensor, and (iii) a transmitted beam that is transmitted through the optical element and is directed at and impinges on the grating to create a first measurement beam that is diffracted by the grating and directed back though the optical element and then toward the first image sensor, and a second measurement beam that is diffracted by the grating and directed back through the optical element and then toward the second image sensor.

* * * * *